United States Patent
Ho et al.

(10) Patent No.: US 12,219,780 B2
(45) Date of Patent: Feb. 4, 2025

(54) HIGH-DENSITY MEMORY DEVICE WITH PLANAR THIN FILM TRANSISTOR (TFT) SELECTOR AND METHODS FOR MAKING THE SAME

(71) Applicant: Taiwan Semiconductor Manufacturing Company Limited, Hsinchu (TW)

(72) Inventors: Yen-Chung Ho, Hsinchu (TW); Hui-Hsien Wei, Taoyuan (TW); Mauricio Manfrini, Hsinchu (TW); Chia-Jung Yu, Hsinchu (TW); Yong-Jie Wu, Tainan (TW); Ken-Ichi Goto, Hsinchu (TW); Pin-Cheng Hsu, Zhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/346,079

(22) Filed: Jun. 30, 2023

(65) Prior Publication Data
US 2023/0345740 A1    Oct. 26, 2023

Related U.S. Application Data

(63) Continuation of application No. 17/222,123, filed on Apr. 5, 2021, now Pat. No. 11,737,288.
(Continued)

(51) Int. Cl.
*H10B 63/00* (2023.01)
*H10B 53/30* (2023.01)
*H10B 61/00* (2023.01)

(52) U.S. Cl.
CPC ............ *H10B 63/30* (2023.02); *H10B 53/30* (2023.02); *H10B 61/22* (2023.02)

(58) Field of Classification Search
CPC ...... H10N 70/826; H10B 63/80; H10B 63/84; H10B 63/30; H10B 53/30; H10B 61/22; H01L 29/786
See application file for complete search history.

(56) References Cited

U.S. PATENT DOCUMENTS

| | | | |
|---|---|---|---|
| 2005/0164454 A1 | 7/2005 | Leslie | |
| 2014/0353662 A1* | 12/2014 | Shukh | H10B 63/30 257/43 |

(Continued)

FOREIGN PATENT DOCUMENTS

| CN | 111052379 A | 4/2020 |
|---|---|---|
| JP | H11340442 A | 12/1999 |
| WO | 2019066967 A1 | 4/2019 |

OTHER PUBLICATIONS

Grill et al., Progress in the development and understanding of advanced low k and ultralow k dielectrics for very large scale integrated interconnects—State of the art, Appl. Phys. Rev. 1, 011306 (2014) (Year: 2014).*

(Continued)

*Primary Examiner* — Shih Tsun A Chou
(74) *Attorney, Agent, or Firm* — The Marbury Law Group, PLLC

(57) ABSTRACT

A memory device and method of making the same, the memory device including bit lines disposed on a substrate; memory cells disposed on the bit lines; a first dielectric layer disposed on the substrate, surrounding the bit lines and the memory cells; a second dielectric layer disposed on the first dielectric layer; thin film transistors (TFTs) embedded in the second dielectric layer and configured to selectively provide electric power to corresponding memory cells, the TFTs comprising drain lines disposed on the memory cells, source lines disposed on the first dielectric layer, and selector layers electrically connected to the source lines and the drain lines;

(Continued)

and word lines disposed on the second dielectric layer and electrically connected to the TFTs.

20 Claims, 36 Drawing Sheets

Related U.S. Application Data

(60) Provisional application No. 63/031,717, filed on May 29, 2020.

(56) References Cited

U.S. PATENT DOCUMENTS

| 2018/0211910 A1* | 7/2018 | Lee | H10N 50/10 |
| 2019/0131187 A1* | 5/2019 | Le | B82Y 10/00 |
| 2019/0273119 A1* | 9/2019 | Zhou | H10B 63/30 |
| 2020/0091156 A1 | 3/2020 | Sharma et al. | |
| 2020/0302984 A1 | 6/2020 | Kai et al. | |
| 2020/0373312 A1 | 11/2020 | Sharma | |

OTHER PUBLICATIONS

CMOS, Wikipedia, archived Jan. 18, 2019 (Year: 2019).*
Sze et al., Physics of Semiconductor Devices, Third Edition, 2007 John Wiley & Sons, Appendix H (Year: 2007).*
Taiwan Patent and Trademark Office, Application No. 110118548 Office Action, mailed Feb. 22, 2022, 6 pages.
Korean Patent and Trademark Office, Application No. 10-2021-0069367 Office Action mailed Dec. 3, 2022, 7 pages.
Korean Patent and Trademark Office, Application No. 10-2021-0069367; Notice of Allowance mailed Aug. 29, 2023 8 pages.
Chinese Patent and Trademark Office, CN Application No. 202110617652.X; first Office Action mailed May 28, 2024 16 pages.

* cited by examiner

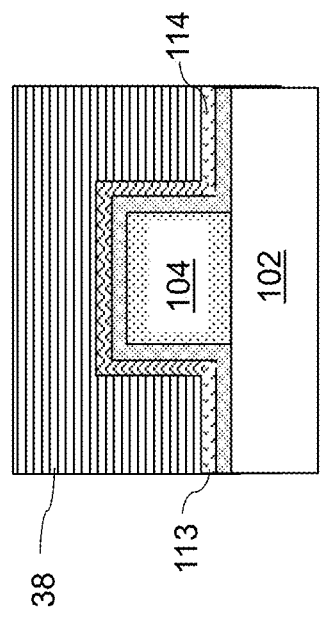
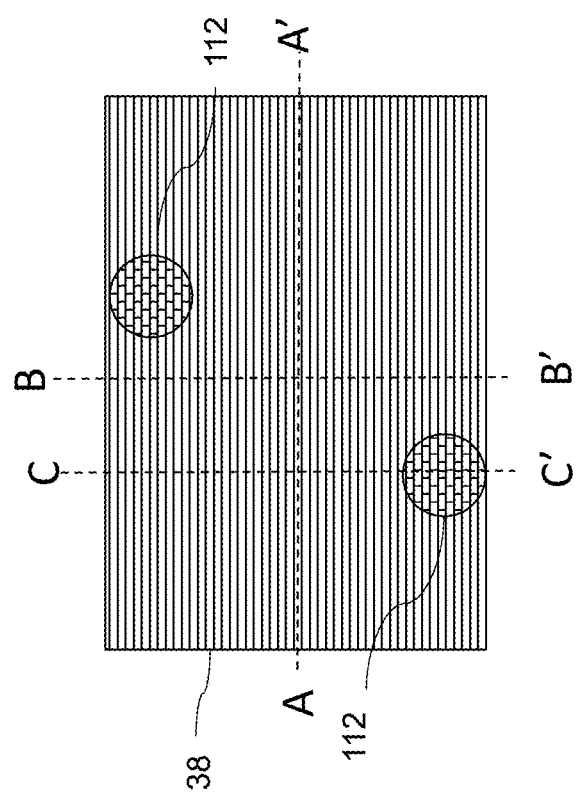
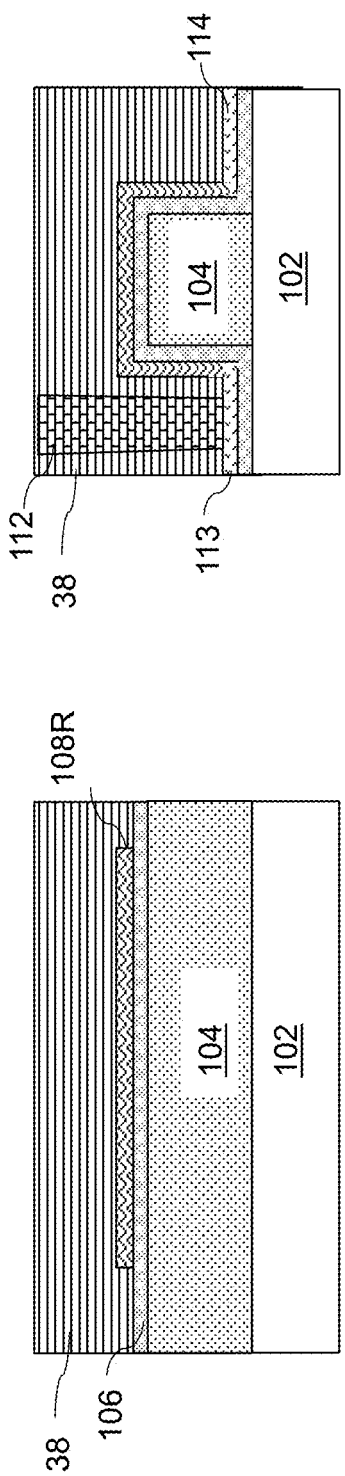

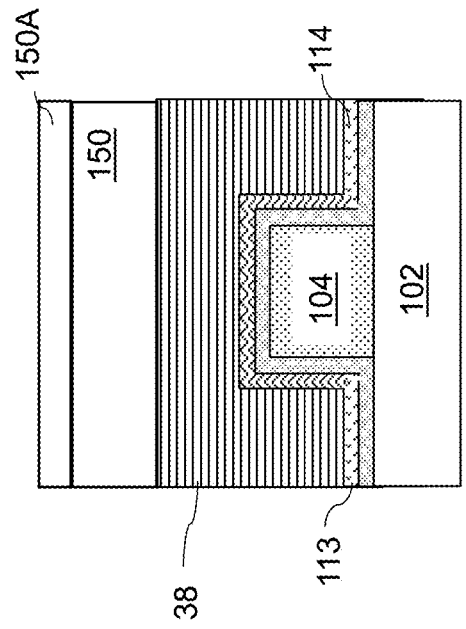
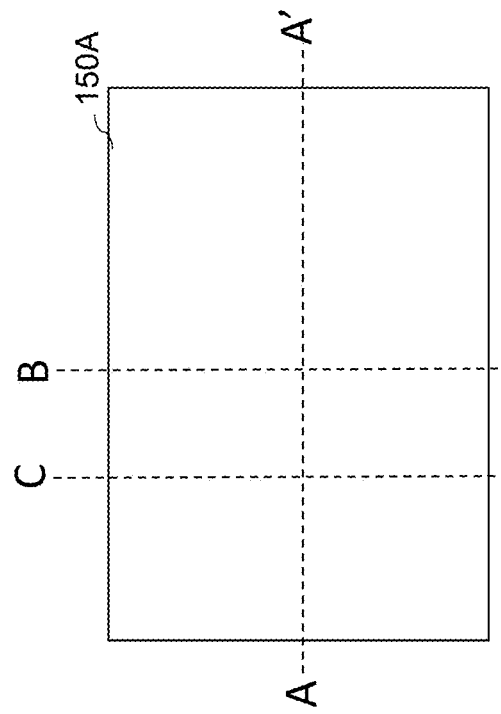
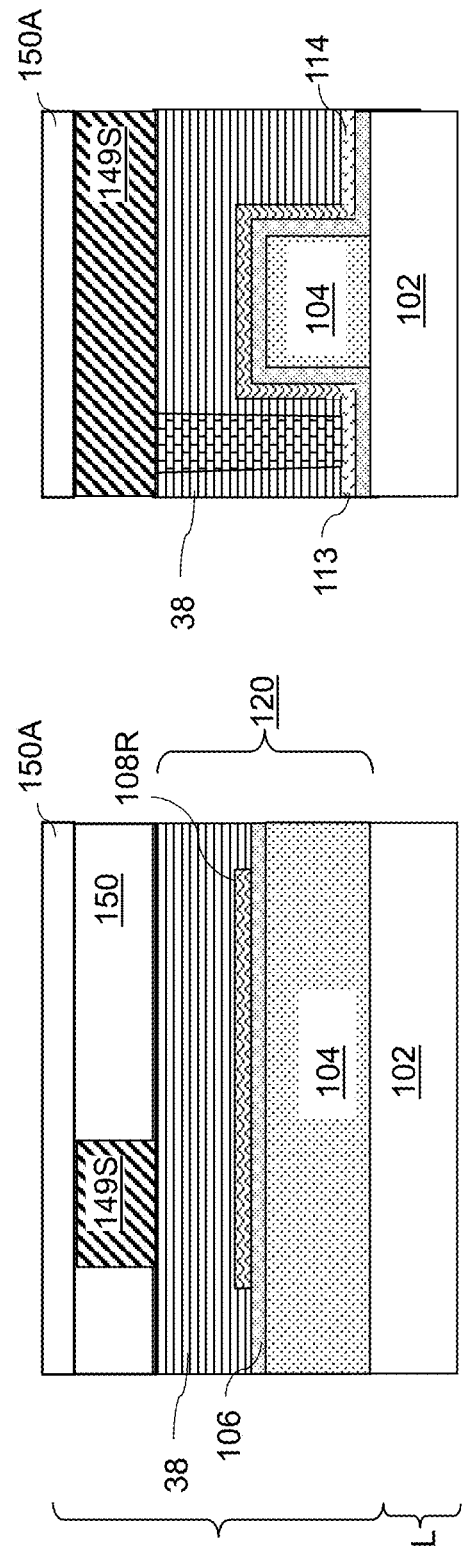

HIGH-DENSITY MEMORY DEVICE WITH PLANAR THIN FILM TRANSISTOR (TFT) SELECTOR AND METHODS FOR MAKING THE SAME

RELATED APPLICATIONS

This application is a continuation of U.S. patent application Ser. No. 17/222,123 entitled "High-Density Memory Device with Planar Thin Film Transistor (TFT) Selector and Methods for Making the Same", filed Apr. 5, 2023, which claims priority to U.S. Provisional Patent Application No. 63/031,717, entitled "High-Density Memory Device with Planar TFT Selector", filed on May 29, 2020, the entire contents of both of which are hereby incorporated by reference for all purposes.

BACKGROUND

In the semiconductor industry, there is constant desire to increase the areal density of integrated circuits. To do so, individual transistors have become increasingly smaller. However, the rate at which individual transistors may be made smaller is slowing. Moving peripheral transistors from the front-end-of-line (FEOL) to the back-end-of Line (BEOL) position of fabrication may be advantageous because functionality may be added at the BEOL while valuable chip area may be made available in the FEOL. Thin film transistors (TFT) made of oxide semiconductors are an attractive option for BEOL integration since TFTs may be processed at low temperatures and thus, will not damage previously fabricated devices.

Non-volatile memory (NVM) is a type of computer memory that can retrieve stored information even after having been power cycled. In contrast, volatile memory needs constant power in order to retain data. Non-volatile memory typically refers to storage in semiconductor memory chips, which store data in floating-gate memory cells consisting of floating-gate MOSFETs (metal-oxide-semiconductor field-effect transistors), including flash memory storage such as NAND flash and solid-state drives (SSD), and ROM chips such as EPROM (erasable programmable ROM) and EEPROM (electrically erasable programmable ROM). Typically, the selection and activation of individual memory cells is done using conventional CMOS transistors. As noted above, such conventional transistors are fabricated in a FEOL position and occupy valuable chip area. Smaller TFTs may be used to replace conventional CMOS transistors to select memory cells in a memory device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7A is a top view illustrating a step of depositing an interconnect level dielectric layer over the intermediate structure illustrated in FIGS. 6A-6C and forming active region via contacts in a method of making a transistor according to an embodiment of the present disclosure.

FIG. 7B is a vertical cross-sectional view through line AA' of FIG. 7A.

FIG. 7C is a vertical cross-sectional view through line BB' of FIG. 7A.

FIG. 7D is a vertical cross-sectional view through line CC' of FIG. 7A.

FIG. 9A is a top view of the exemplary structure after deposition of an interlayer dielectric according to an embodiment of the present disclosure.

FIG. 9B is a vertical cross-sectional view through line AA' of FIG. 9A.

FIG. 9C is a vertical cross-sectional view through line BB' of FIG. 9A.

FIG. 9D is a vertical cross-sectional view through line CC' of FIG. 9A.

DETAILED DESCRIPTION

Figure 1A:
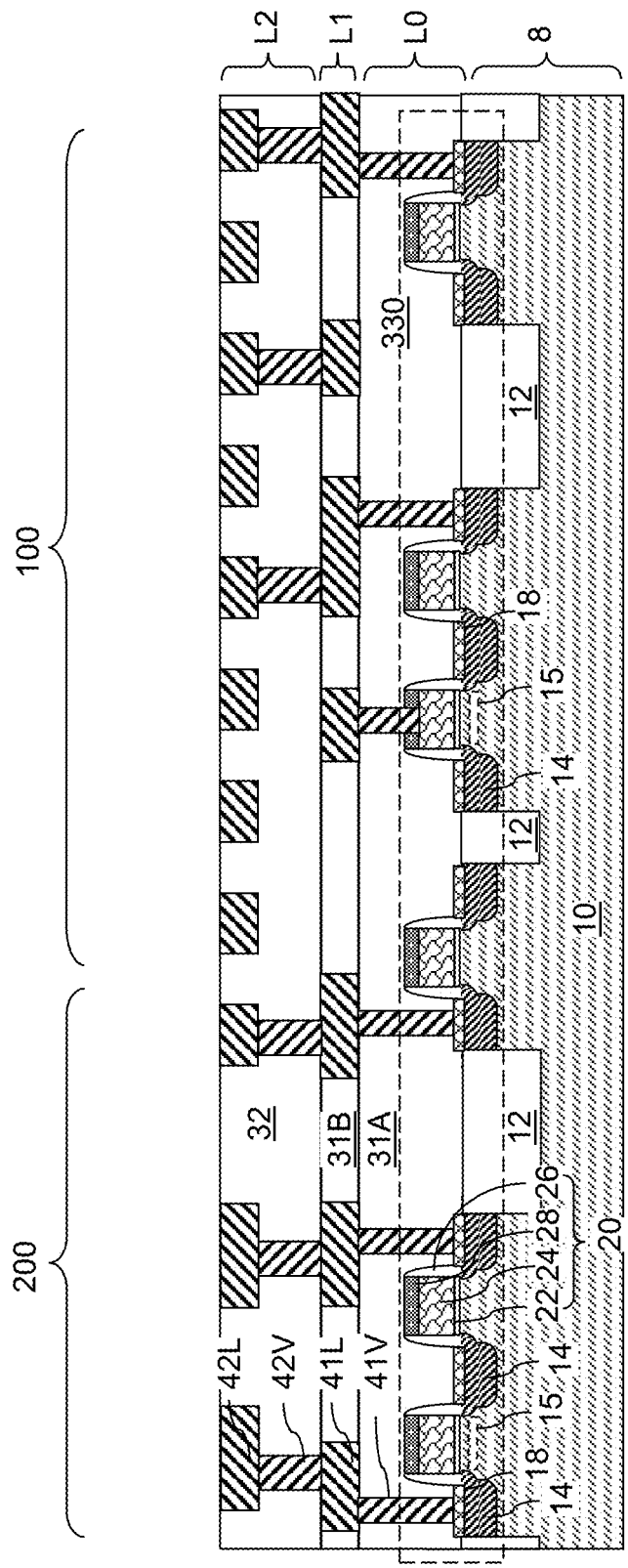
FIG. 1A is a vertical cross-sectional view of a first exemplary structure prior to formation of an array of TFTs according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Emerging memory technologies promise new memories to store more data at less cost than the expensive-to-build silicon chips used by popular consumer electronics.

Such memory devices may be used to replace a flash memory in near future. However, although existing resistive random-access memories have generally been adequate for their intended purposes, as device scaling-down continues, they have not been entirely satisfactory in all respects.

Memory devices include a grid of independently functioning memory cells formed on a substrate. Memory devices may include volatile memory cells or nonvolatile (NV) memory cells. Emerging nonvolatile memory technologies include resistive random-access memory (RRAM or ReRAM), magnetic/magneto-resistive random-access memory (MRAM), ferroelectric random-access memory (FeRAM), and phase-change memory (PCM), for example.

RRAM is a type of NV RAM that works by changing the resistance across a dielectric solid-state material, often referred to as a memristor.

MRAM is a type of NV RAM that stores data in magnetic domains. Unlike conventional RAM chip technologies, data in MRAM is not stored as electric charge or current flows, but by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. If the insulating layer is thin enough (typically a few nanometres), electrons can tunnel from one ferromagnet into the other. This configuration is known as a magnetic tunnel junction (MTJ) and is the simplest structure for an MRAM bit.

FeRAM is a NV RAM similar in construction to dynamic random access memory (DRAM) both use a capacitor and transistor but instead of using a simple dielectric layer of the capacitor, a F-RAM cell contains a thin ferroelectric film of lead zirconate titanate [$Pb(Zr,Ti)O_3$], commonly referred to as PZT. The Zr/Ti atoms in the PZT change polarity in an electric field, thereby producing a binary switch. Due to the PZT crystal maintaining polarity, FeRAM retains its data memory when power is shut off or interrupted.

Due to this crystal structure and how it is influenced, FeRAM offers distinct properties from other nonvolatile memory options, including extremely high, although not infinite, endurance (exceeding 1016 read/write cycles for 3.3 V devices), ultra-low power consumption (since FeRAM does not require a charge pump like other non-volatile memories), single cycle write speeds, and gamma radiation tolerance.

PCM is a type of NV RAM. PCMs exploit the unique behavior of chalcogenide glass. In the older generation of PCM, heat produced by the passage of an electric current through a heating element generally made of TiN was used to either quickly heat and quench the glass, making it amorphous, or to hold it in its crystallization temperature range for some time, thereby switching it to a crystalline state. PCM also has the ability to achieve a number of distinct intermediary states, thereby having the ability to hold multiple bits in a single cell, but the difficulties in programming cells in this way has prevented these capabilities from being implemented in other technologies (most notably flash memory) with the same capability.

Integrated circuit (IC) formation may include front-end-of-line (FEOL) and back-end-of-line (BEOL). FEOL is the first portion of IC fabrication where the individual devices (transistors, capacitors, resistors, etc.) are patterned in a semiconductor substrate. FEOL generally covers everything up to (but not including) the deposition of metal interconnect layers.

For example, when forming complementary metal-oxide-semiconductor (CMOS), FEOL contains all fabrication steps needed to form fully isolated CMOS elements, such as: selecting the type of wafer to be used; chemical-mechanical planarization and cleaning of the wafer; shallow trench isolation (STI); well formation; gate module formation; and source and drain module formation.

After the last FEOL step, there is a wafer with isolated transistors (without any wires). BEOL is the second portion of IC fabrication where the individual devices (transistors, capacitors, resistors, etc.) get interconnected with wiring on the wafer, the metalization layer. Common metals are copper and aluminum. BEOL generally begins when the first layer of metal is deposited on the wafer. BEOL includes contacts, insulating layers (dielectrics), metal levels, and bonding sites for chip-to-package connections. For modern IC process, more than 10 metal layers can be added during the BEOL.

Thin-film transistors (TFTs) provide a number of advantages for BEOL integration. For example, TFTs may be processed at low temperature and may add functionality to the BEOL while valuable chip area may be made available in the FEOL. Use of TFTs in the BEOL may be used as a scaling path for 3 nm node fabrication (N3) or beyond by moving peripheral devices such as power gates or Input/Output (I/O) devices from the FEOL into higher metal levels of the BEOL. Moving the TFTs from the FEOL to the BEOL may result in about 5-10% area shrink for a given device.

TFT's which may be moved from the FEOL to the BEOL include, but are not limited to, power gates, input/output elements and memory selectors. In current technology, power gates are logic transistors which are located in the FEOL. Power gates may be used to switch off logic blocks in standby, thereby reducing static power consumption. I/O devices are the interface between a computing element (e.g., CPU) and the outside world (e.g., a hard drive) and are also processed in the FEOL. The selector for a memory element, such as a magnetoresistive random-access memory (MRAM) or a resistive random-access memory (RRAM) is presently located in the FEOL and may be moved to the BEOL. Typically, there is one selector TFT for each memory element.

Back gate or bottom gate transistors have a gate electrode on the bottom of the TFT in contrast to a top gate transistor in which the gate electrode is located on the top of the transistor. In general, a bottom gate TFT may be fabricated as follows. First, a layer of gate metal may be deposited on a substrate and patterned to form a gate electrode. The substrate may be made of any suitable materials, such silicon or silicon-on-insulator. The gate metal may be made of copper, aluminum, zirconium, titanium, tungsten, tantalum, ruthenium, palladium, platinum, cobalt, nickel or alloys thereof. Other suitable materials are within the contemplated scope of disclosure. The gate metal may be deposited by any suitable technique, such as chemical vapor deposition (CVD), plasma enhanced chemical vapor deposition (PECVD) or atomic layer deposition (ALD).

Next, a high-k dielectric layer may be deposited over the gate electrode. High-k dielectric materials are materials with a dielectric constant higher than silicon dioxide and include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$). Other suitable materials are within the contemplated scope of disclosure.

Next a layer of semiconducting material may be deposited over the high-k dielectric layer. The layer of semiconducting material may be patterned and ion implanted to form active regions (source/drain regions) and a channel region located between the active regions. The semiconducting material may be made from amorphous silicon or a semiconducting oxide, such as InGaZnO, InWO, InZnO, InSnO, $GaO_x$, $InO_x$ and the like. Other suitable materials are within the contemplated scope of disclosure. The semiconducting material may be formed by any suitable method such as CVD, PECVD or atomic layer deposition ALD.

Referring to FIG. 1A, a first exemplary structure according to an embodiment of the present disclosure is illustrated prior to formation of an array of fin back gate field effect transistors. The first exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). The exemplary structure may include various devices regions, which may include a memory array region 100 in which at least one array of non-volatile memory cells may be subsequently formed. For example, the at least one array of non-volatile memory cells may include resistive random-access memory (RRAM or ReRAM), magnetic/magneto-resistive random-access memory (MRAM), ferroelectric random-access memory (FeRAM), and phase-change memory (PCM) devices. The exemplary structure may also include a peripheral region 200 in which electrical connections between each array of non-volatile memory cells and a peripheral circuit including field effect transistors may be subsequently formed. Areas of the memory array region 100 and the peripheral region 200 may be employed to form various elements of the peripheral circuit.

Semiconductor devices such as field effect transistors may be formed on, and/or in, the semiconductor material layer 10. For example, shallow trench isolation structures 12 may be formed in an upper portion of the semiconductor material layer 10 by forming shallow trenches and subsequently filling the shallow trenches with a dielectric material such as silicon oxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a gate cap dielectric 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed that use the gate structures 20 as self-aligned implantation masks to form deep active regions. Such deep active regions may include deep source regions and deep drain regions. Upper portions of the deep active regions may overlap with portions of the extension implantation regions. Each combination of an extension implantation region and a deep active region may constitute an active region 14, which may be a source region or a drain region depending on electrical biasing. A semiconductor channel 15 may be formed underneath each gate stack (22, 24, 28) between a neighboring pair of active regions 14. Metal-semiconductor alloy regions 18 may be formed on the top surface of each active region 14. Field effect transistors may be formed on the semiconductor material layer 10. Each field effect transistor may include a gate structure 20, a semiconductor channel 15, a pair of active regions 14 (one of which functions as a source region and another of which functions as a drain region), and optional metal-semiconductor alloy regions 18. A complementary metal-oxide-semiconductor (CMOS) circuit 330 may be provided on the semiconductor material layer 10, which may include a periphery circuit for the array(s) of TFTs to be subsequently formed. In other embodiments, the CMOS circuit 330 may include a fin field-effect transistor (FinFET). A FinFet is a multi-gate device, such as a metal-oxide-semiconductor field-effect transistor (MOSFET) built on a substrate where the gate is formed on two, three, or four sides of the channel or wrapped around the channel, forming a double gate structure. These devices are generically referred to as FinFETs because the source/drain region forms fins on the silicon surface. FinFET devices may have significantly faster switching times and higher current density than planar CMOS technology.

Various interconnect-level structures may be subsequently formed, which are formed prior to formation of an array of fin back gate field effect transistors and are herein referred to as lower interconnect-level structures (L0, L1, L2). In case a two-dimensional array of TFTs is to be subsequently formed over two levels of interconnect-level metal lines, the lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 includes a first interconnect level dielectric layer 31B and first metal lines 41L formed within the first interconnect level dielectric layer 31B. The first interconnect level dielectric layer 31B is also referred to as a first line-level dielectric layer. The first metal lines 41L may contact a respective one of the contact via structures 41V. The second interconnect-level structure L2 includes a second interconnect level dielectric layer 32, which may include a stack of a first via-level dielectric material layer and a second line-level dielectric material layer or a line-and-via-level dielectric material layer. The second interconnect level dielectric layer 32 may be formed within second interconnect-level metal interconnect structures (42V, 42L), which includes first metal via structures 42V and second metal lines 42L. Top surfaces of the second metal lines 42L may be coplanar with the top surface of the second interconnect level dielectric layer 32.

Figure 1B:
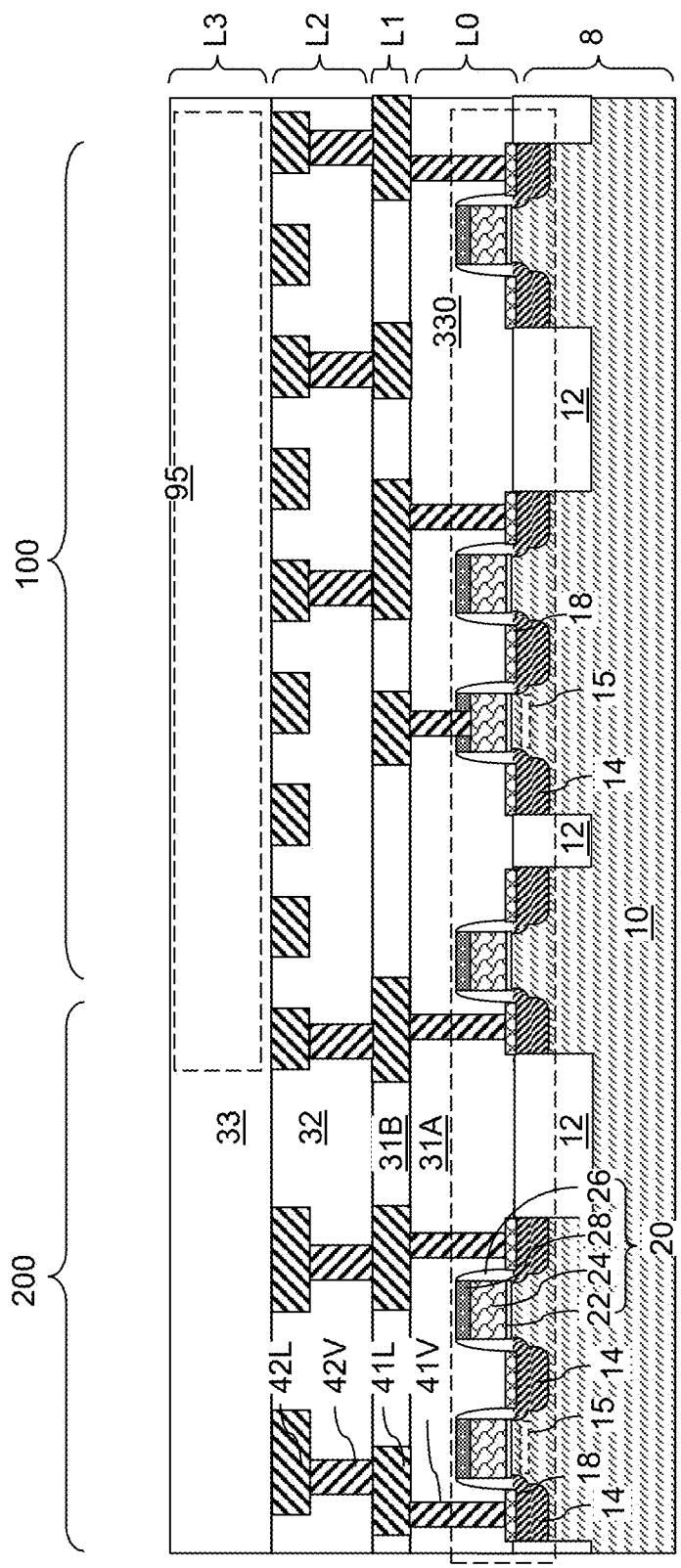
FIG. 1B is a vertical cross-sectional view of the first exemplary structure during formation of the array of fin back gate field effect transistors according to an embodiment of the present disclosure.

Referring to FIG. 1B, an array 95 of non-volatile memory cells and TFT selector devices may be formed in the memory array region 100 over the second interconnect-level structure L2. The details for the structure and the processing steps for the array 95 of non-volatile memory cells and TFT selector devices are subsequently described in detail below. A third interconnect level dielectric layer 33 may be formed during formation of the array 95 of non-volatile memory cells and TFT selector devices. The set of all structures formed at the level of the array 95 of non-volatile memory cells and TFT selector devices transistors is herein referred to as a third interconnect-level structure L3.

Figure 1C:
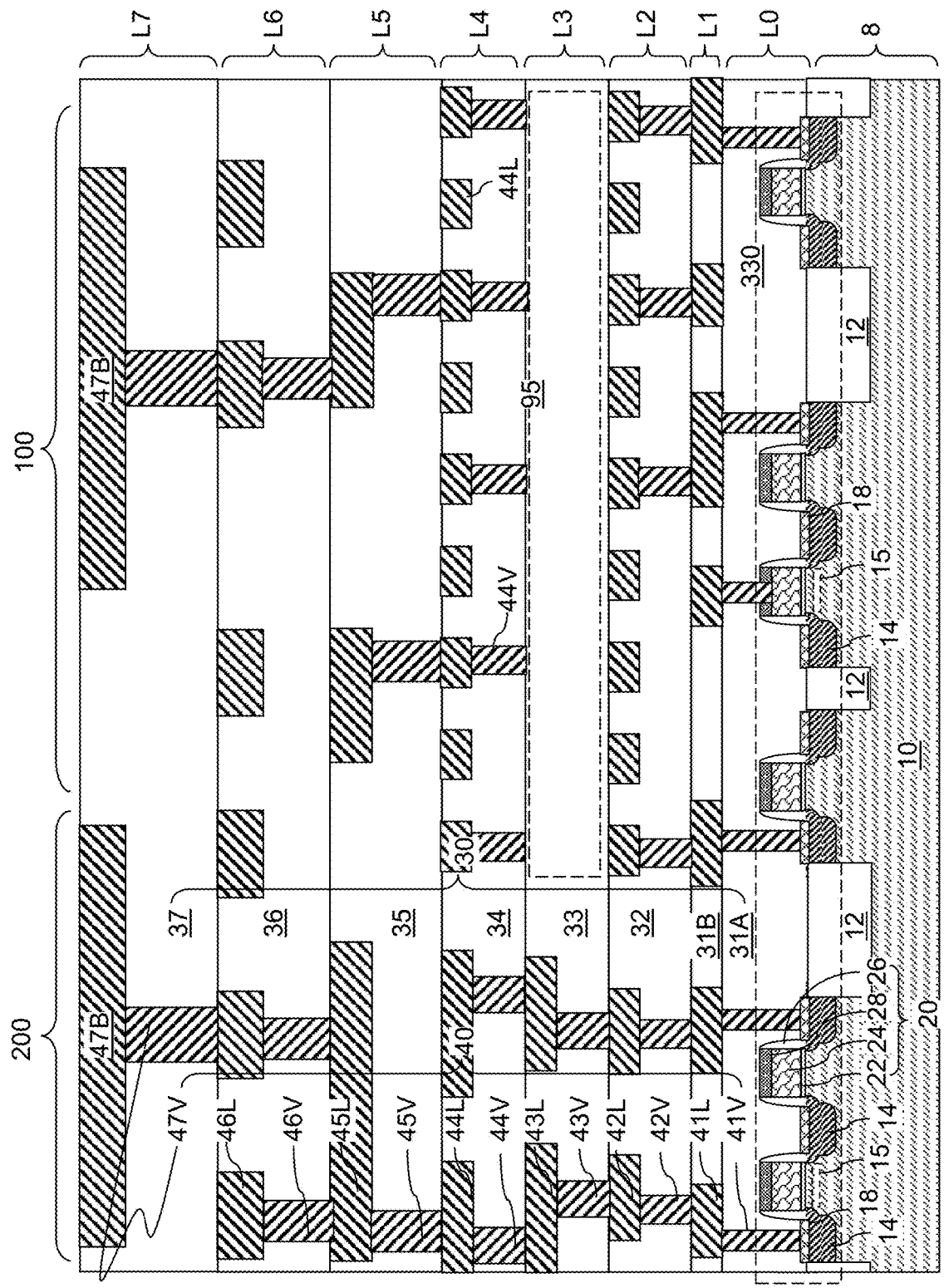
FIG. 1C is a vertical cross-sectional view of the first exemplary structure after formation of upper-level metal interconnect structures according to an embodiment of the present disclosure.

Referring to FIG. 1C, third interconnect-level metal interconnect structures (43V, 43L) may be formed in the third interconnect level dielectric layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth interconnect level dielectric layer 34 having formed therein fourth interconnect-level metal interconnect structures (44V, 44L), which may include third metal via structures 44V and fourth metal lines 44L. The fifth interconnect-level structure L5 may include a fifth interconnect level dielectric layer 35 having formed therein fifth interconnect-level metal interconnect structures (45V, 45L), which may include fourth metal via structures 45V and fifth metal lines 45L. The sixth interconnect-level structure L6 may include a sixth interconnect level dielectric layer 36 having formed therein sixth interconnect-level metal interconnect structures (46V, 46L), which may include fifth metal via structures 46V and sixth metal lines 46L. The seventh interconnect-level structure L7 may include a seventh interconnect level dielectric layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding) or may be configured for metal-to-metal bonding (such as copper-to-copper bonding).

Each interconnect level dielectric layer may be referred to as an interconnect level dielectric (ILD) layer 30. Each interconnect-level metal interconnect structures may be referred to as a metal interconnect structure 40. Each contiguous combination of a metal via structure and an overlying metal line located within a same interconnect-level structure (L2-L7) may be formed sequentially as two distinct structures by employing two single damascene processes or may be simultaneously formed as a unitary structure employing a dual damascene process. Each of the metal interconnect structure 40 may include a respective metallic liner (such as a layer of TiN, TaN, or WN having a thickness in a range from 2 nm to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop dielectric layers and dielectric capping layers may be inserted between vertically neighboring pairs of ILD layers 30 or may be incorporated into one or more of the ILD layers 30.

While the present disclosure is described employing an embodiment in which the array 95 of non-volatile memory cells and TFT selector devices may be formed as a component of a third interconnect-level structure L3, embodiments are expressly contemplated herein in which the array 95 of non-volatile memory cells and TFT selector devices may be formed as components of any other interconnect-level structure (e.g., L1-L7). Further, while the present disclosure is described using an embodiment in which a set of eight interconnect-level structures are formed, embodiments are expressly contemplated herein in which a different number of interconnect-level structures is used. In addition, embodiments are expressly contemplated herein in which two or more arrays 95 of non-volatile memory cells and TFT selector devices may be provided within multiple interconnect-level structures in the memory array region 100. While the present disclosure is described employing an embodiment in which an array 95 of non-volatile memory cells and TFT selector devices may be formed in a single interconnect-level structure, embodiments are expressly contemplated herein in which an array 95 of non-volatile memory cells and TFT selector devices may be formed over two vertically adjoining interconnect-level structures.

Figure 2A:
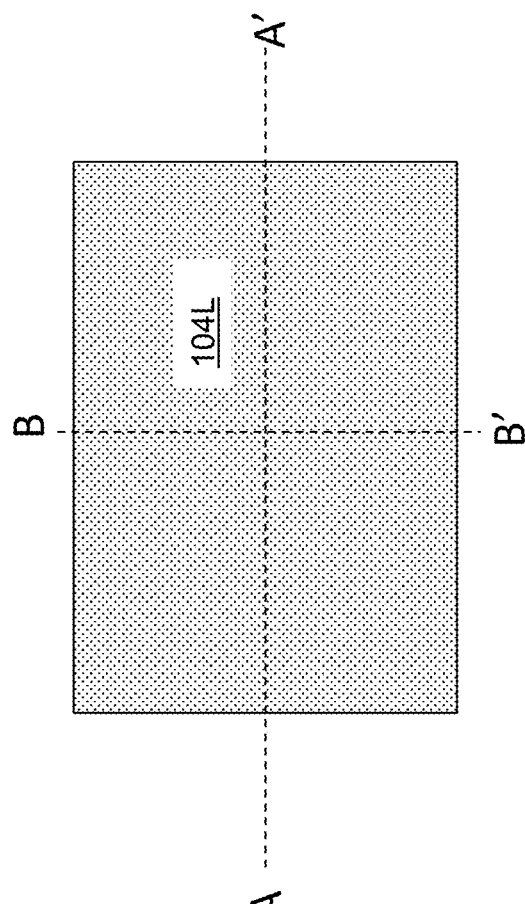
FIG. 2A is a top view illustrating a step of depositing a layer of gate metal on a substrate in a method of making a TFT according to an embodiment of the present disclosure.
Figure 2B:
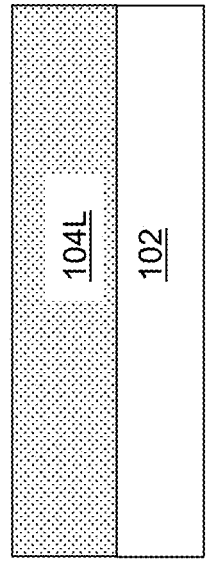
FIG. 2B is a vertical cross-sectional view through line AA' of FIG. 2A.
Figure 2C:
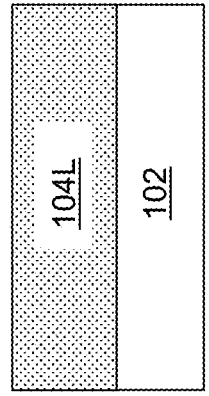
FIG. 2C is a vertical cross-sectional view through line BB' of FIG. 2A.

FIGS. 2A-7D illustrate various TFT 120 and methods of making the various TFTs 120 at various stages of fabrication. Referring to FIGS. 2A-2C, a layer of gate metal 104L may be deposited on a substrate 102. In an embodiment, the TFT 120 may be formed as part of an interconnect structure in an integrated semiconductor device. For example, the TFT 120 may be formed as part of the third interconnect-level structure L3 in which case the second interconnect level dielectric layer 32 may take the place of the substrate 102. The layer of gate metal 104L may be made of any suitable metal, such as copper, aluminum, zirconium, titanium, tungsten, tantalum, ruthenium, palladium, platinum, cobalt, nickel, or alloys thereof. Other suitable materials are within the contemplated scope of disclosure. The layer of gate metal 104L may be deposited by any suitable technique, such as chemical vapor deposition (CVD), plasma enhanced chemical vapor deposition (PECVD) or atomic layer deposition (ALD).

Figure 3A:
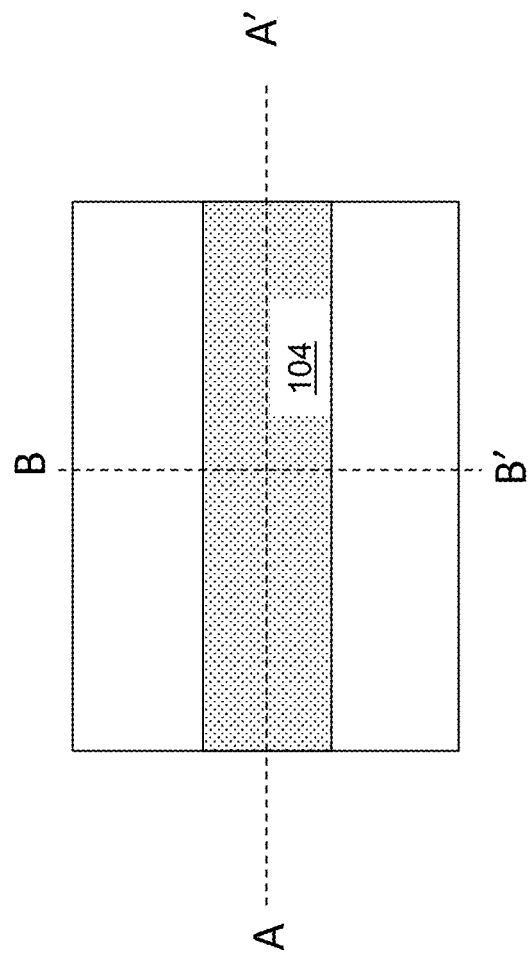
FIG. 3A is a top view illustrating a step of patterning the layer of gate metal in a method of making a TFT according to an embodiment of the present disclosure.
Figure 3B:
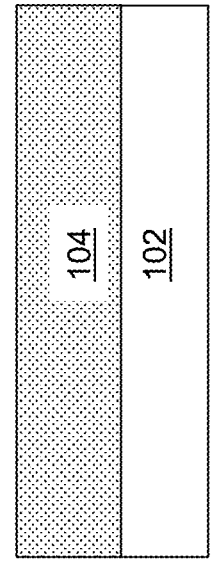
FIG. 3B is a vertical cross-sectional view through line AA' of FIG. 3A.
Figure 3C:
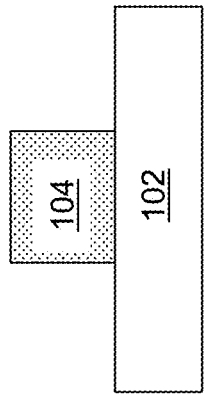
FIG. 3C is a vertical cross-sectional view through line BB' of FIG. 3A.

Referring to FIGS. 3A-3C, the layer of gate metal 104L may be patterned. To pattern the layer of gate metal 104L, a photoresist (not shown) may be deposited over the layer of gate metal 104L and patterned via photolithography techniques. The patterned photoresist may be used as a mask while patterning the layer of gate metal 104L. The result of patterning the layer of gate metal 104L is a patterned gate electrode 104. Patterning may be performed by wet etching or dry etching. After etching, any residual photoresist may be removed by ashing or dissolution in a solvent.

Figure 4A:
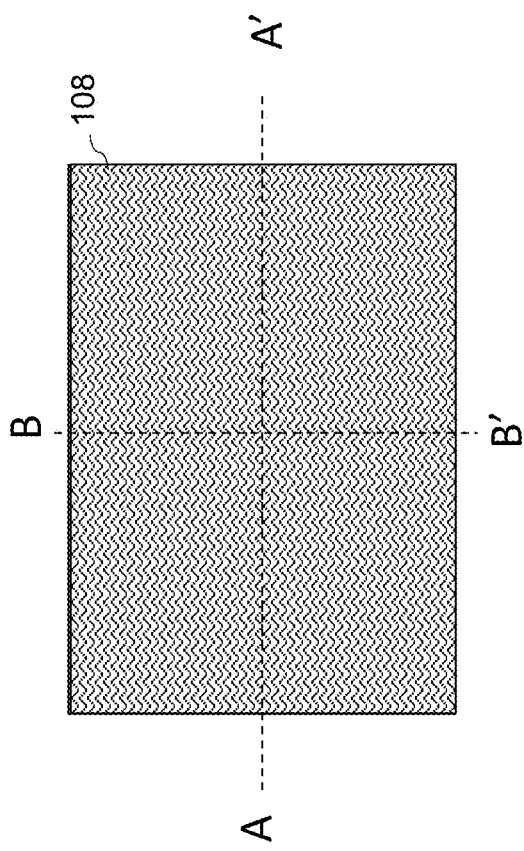
FIG. 4A is a top view illustrating a step of depositing a high k dielectric layer and a channel layer over the substrate and the layer of patterned gate metal in a method of making a TFT according to an embodiment of the present disclosure.
Figure 4B:
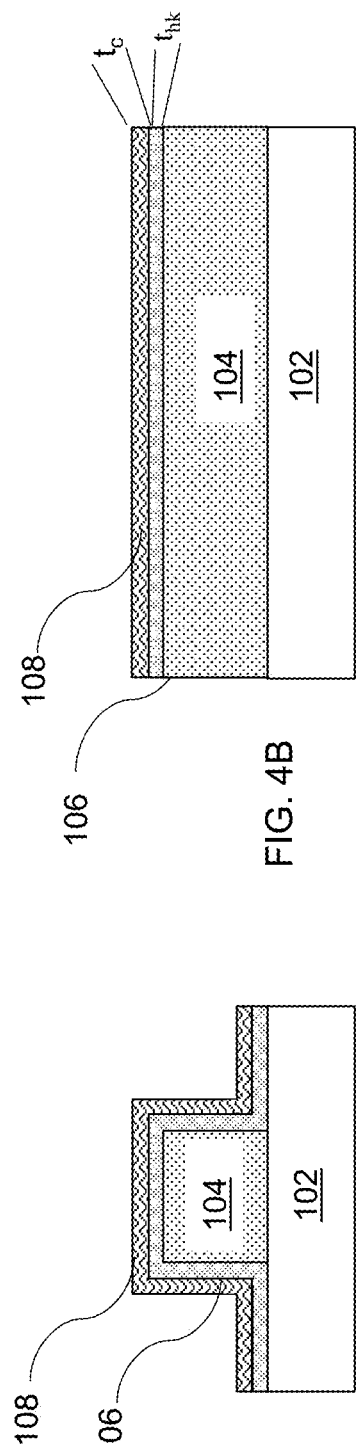
FIG. 4B is a vertical cross-sectional view through line AA' of FIG. 4A.
Figure 4C:
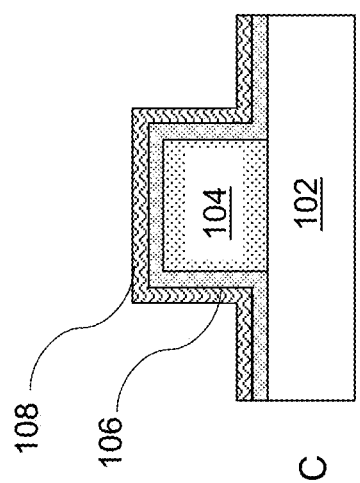
FIG. 4C is a vertical cross-sectional view through line BB' of FIG. 4A.

Referring to FIGS. 4A-4C, a high-k dielectric layer 106 may be conformally deposited over the substrate 102 and the patterned gate electrode 104. Next a channel layer 108 may be conformally deposited over the high-k dielectric layer 106. Examples of high-k dielectric materials include, but are not limited to, hafnium oxide (HfO2), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina (HfO2-Al2O3). Other suitable materials are within the contemplated scope of disclosure. The channel layer 108 comprises a semiconducting material. Example semiconducting materials suitable for the channel layer include, but are not limited to, amorphous silicon or a semiconducting oxide, such as InGaZnO, InWO, InZnO, InSnO, GaOx, InOx and the like. Other suitable materials are within the contemplated scope of disclosure. In various embodiments, the high-k dielectric layer 106 may have a thickness thk in the range of 0.5-5.0 nm, such as 1~4 nm, although greater or lesser thicknesses may be used. In various embodiments, the channel layer 108 may have a thickness tc in the range of 1-20 nm, such as 3-15 nm, although greater or lesser thicknesses may be used.

Figure 5A:
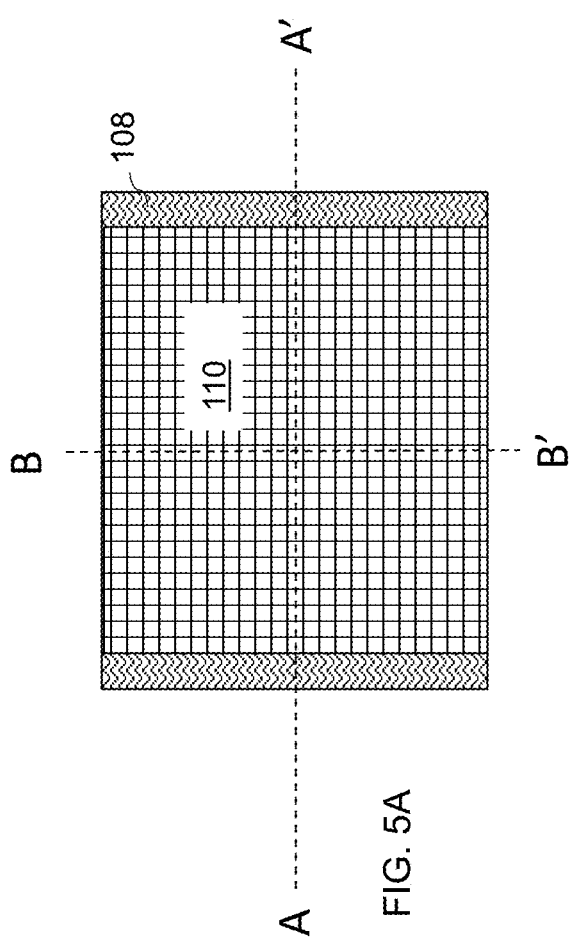
FIG. 5A is a top view illustrating a step of depositing and patterning a hard mask layer over the channel layer in a method of making a TFT according to an embodiment of the present disclosure.
Figure 5B:
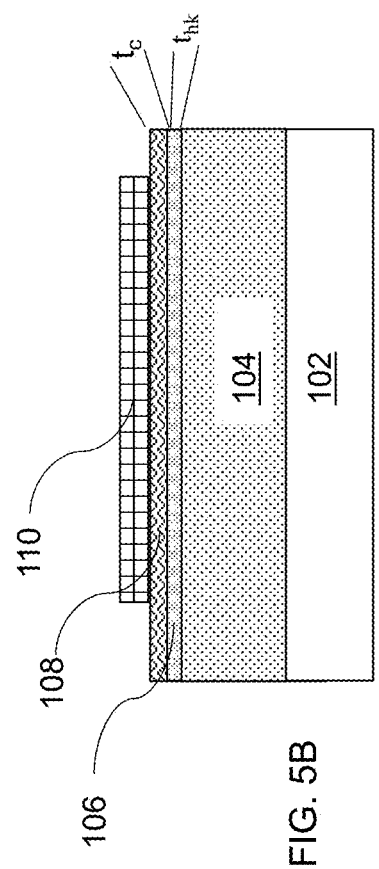
FIG. 5B is a vertical cross-sectional view through line AA' of FIG. 5A.
Figure 5C:
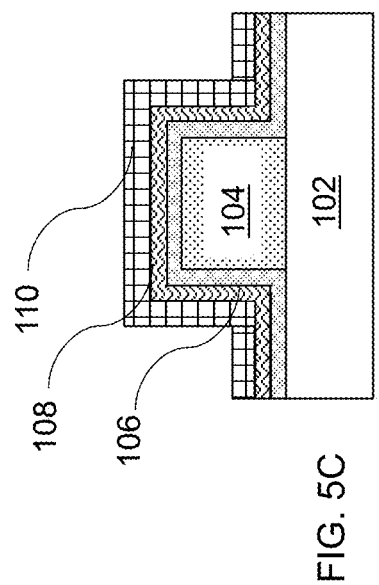
FIG. 5C is a vertical cross-sectional view through line BB' of FIG. 5A.

Referring to FIGS. 5A-5C, a hard mask layer 110 may be deposited over the channel layer 108. The hard mask layer 110 may be made of any suitable material, such as amorphous carbon, organo siloxane based materials, SiN, SiON or combinations thereof. Other suitable materials are within the contemplated scope of disclosure. The hard mask layer 110 may be formed using chemical vapor deposition (CVD), physical vapor deposition (PVD), atomic layer deposition (ALD) or any other suitable process. The hard mask layer 110 may be patterned such that it covers only a portion of the channel layer 108. As illustrated in FIG. 5C, the hard mask layer 110 may cover portions of the channel layer 108 located over the sidewalls of the patterned gate electrode 104.

Figure 6A:
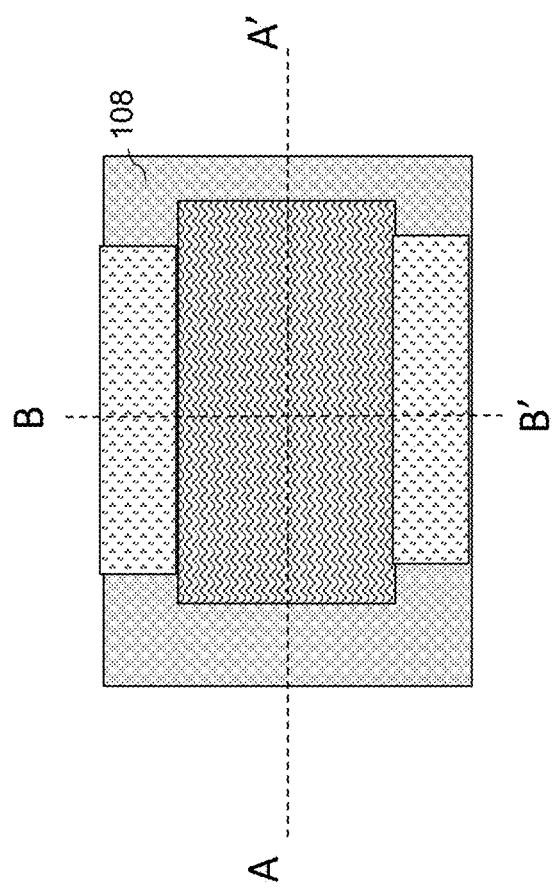
FIG. 6A is a top view illustrating a step of using the hard mask layer to pattern the channel layer in a method of making a TFT according to an embodiment of the present disclosure.
Figure 6B:
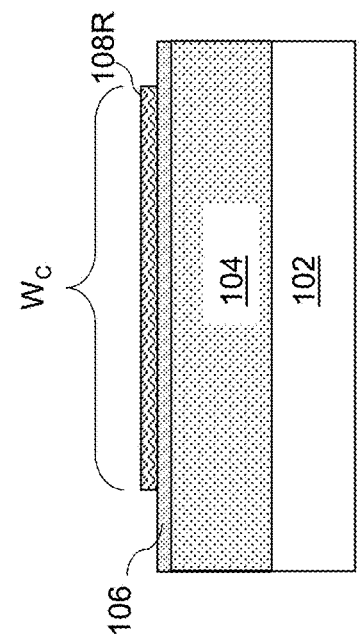
FIG. 6B is a vertical cross-sectional view through line AA' of FIG. 6A.
Figure 6C:
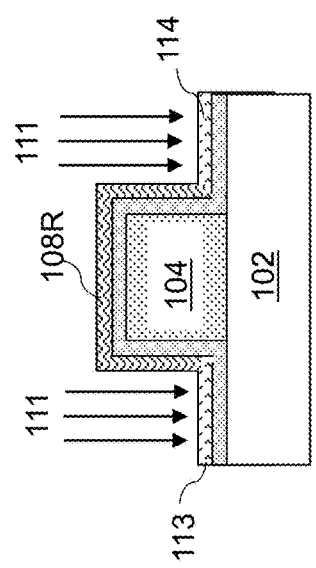
FIG. 6C is a vertical cross-sectional view through line BB' of FIG. 6A.

Referring to FIGS. 6A-6C, the channel layer 108 may be patterned using the hard mask layer 110 as a mask. The channel layer 108 may be patterned by wet etching or dry etching. As illustrated in FIG. 6B, the channel layer 108 may have a channel width WC. The channel width WC may be in the range of 50-300 nm, such as 100-200 nm, although greater or lesser widths may be used. As illustrated in FIGS. 6C, portions of the channel layer 108 may be ion implanted 111 to form active regions (e.g., source/drain regions) 113/114 on either side of a channel region 108R that also is located on either side of the patterned gate electrode 104.

Referring to FIGS. 7A-7D, an interconnect level dielectric (ILD) layer 38 may be deposited over the intermediate structure illustrated in FIGS. 6A-6C. The ILD layer 38 may be made of any suitable material, including but not limited to SiO2. Other suitable materials are within the contemplated scope of disclosure. Via holes (not shown) may then be formed in the ILD layer 38 down to the surface of the active source region 113 and drain region 114. Next, the via holes may be filled with a conducting material to form contacts 112. The conducting material may be TiN, W, Al or any other suitable material. After forming the contacts 112, a planarization step may be performed to planarize the surface of the ILD layer 38 and the top surface of the contacts 112. The planarization step may be performed, for example, by chemical mechanical polishing (CMP).

Figure 8A:
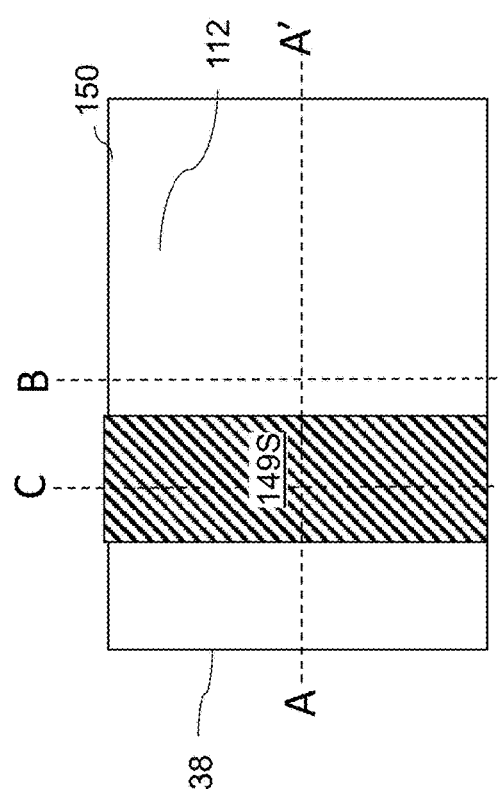
FIG. 8A is a top view of an exemplary structure after formation of source line formed in dielectric material layers according to an embodiment of the present disclosure.
Figure 8C:
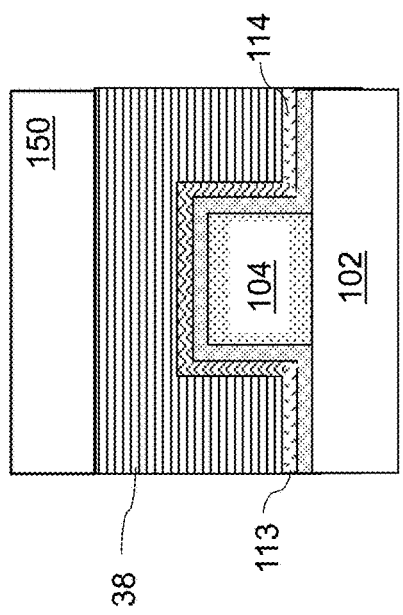
FIG. 8C is a vertical cross-sectional view through line BB' of FIG. 8A.
Figure 8B:
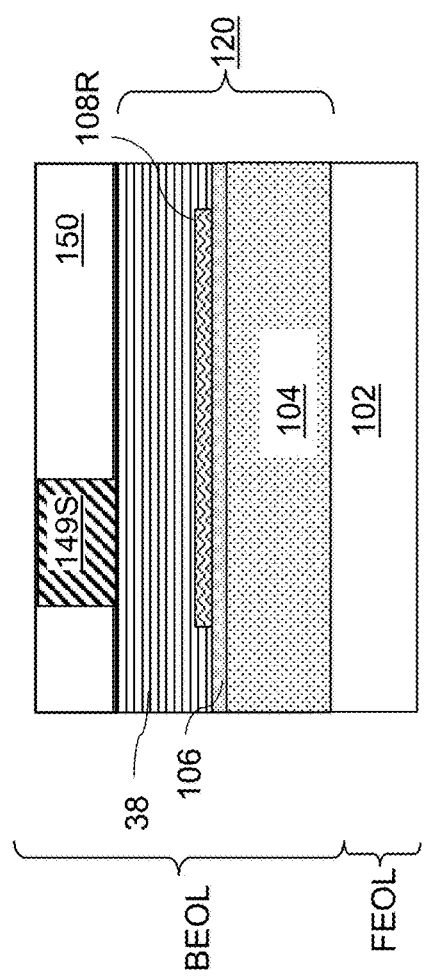
FIG. 8B is a vertical cross-sectional view through line AA' of FIG. 8A.
Figure 8D:
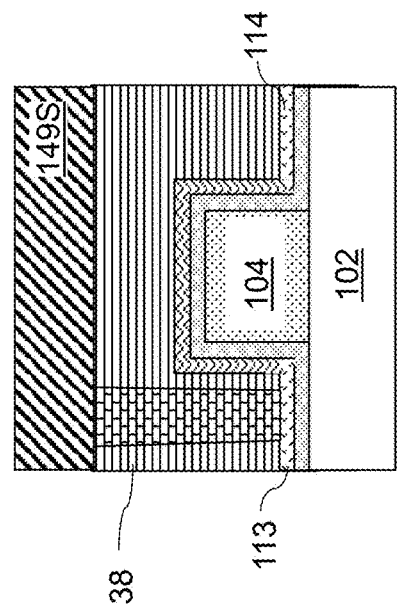
FIG. 8D is a vertical cross-sectional view through line CC' of FIG. 8A.

FIG. 8A is a top view of an exemplary structure after formation of complementary metal-oxide-semiconductor (CMOS) transistors and metal interconnect structures formed in dielectric material layers according to an embodiment of the present disclosure. FIG. 8B is a vertical cross-sectional view through line AA' of FIG. 8A, FIG. 8C is a vertical cross-sectional view through line BB' of FIG. 8A, and FIG. 8D is a vertical cross-sectional view through line CC' of FIG. 8A.

Referring to FIGS. 8A-8D, a step of depositing a layer of dielectric material over the TFT 120 to form a memory device 130, such as a metallic tunnel junction (MTJ) is shown. In particular, a connection-via-level dielectric layer 150 may be sequentially formed over the TFT 120 and ILD layer 38. The connection-via-level dielectric layer 150 may include any material that may be used for the dielectric material layers 30 (31, 32, 33, 34, 35, 36, 37, 38). For example, the connection-via-level dielectric layer 150 may include undoped silicate glass or a doped silicate glass deposited by decomposition of tetraethylorthosilicate (TEOS). The thickness of the connection-via-level dielectric layer 150 may be in a range from 50 nm to 200 nm, although lesser and greater thicknesses may also be used. The connection-via-level dielectric layer 150 may be formed as planar blanket (unpatterned) layer having a respective planar top surface and a respective planar bottom surface that extends throughout the memory array region 100 and the logic region 200. A source line 149S may be formed within the connection-via-level dielectric layer 150 to couple to via 112 and source region 113. Although not depicted in FIGS. 8A-8D, in some embodiments, a separate drain line 149D may be formed to couple the corresponding drain region 114 and bottom electrode 153 of a subsequently fabricated memory device 130.

FIG. 9A is a top view of the exemplary structure after formation of a supplementary dielectric layer 150A to prevent any electrical coupling of the source line with subsequent memory device layers according to an embodiment of the present disclosure. FIG. 9B is a vertical cross-sectional view through line AA' of FIG. 9A, FIG. 9C is a vertical cross-sectional view through line BB' of FIG. 9A, and FIG. 9D is a vertical cross-sectional view through line CC' of FIG. 9A. An additional connection-via-level dielectric layer 150A may be deposited over the formed source line 149S. Additional connection-via-level dielectric layer 150A may be formed from the same material as connection-via-level dielectric layer 150.

Figure 10A:
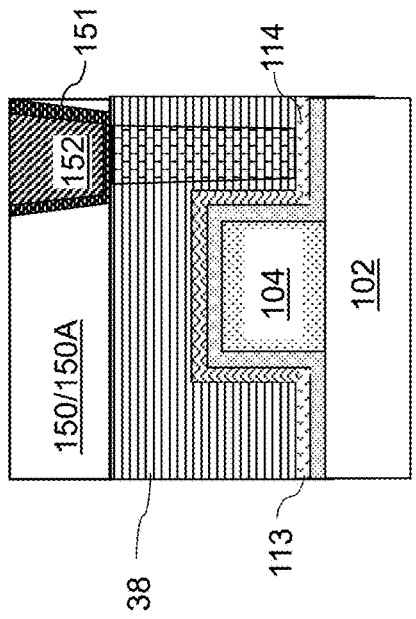
FIG. 10A is a top view of the exemplary structure after forming a drain contact, according to various embodiments of the present disclosure.
Figure 10C:
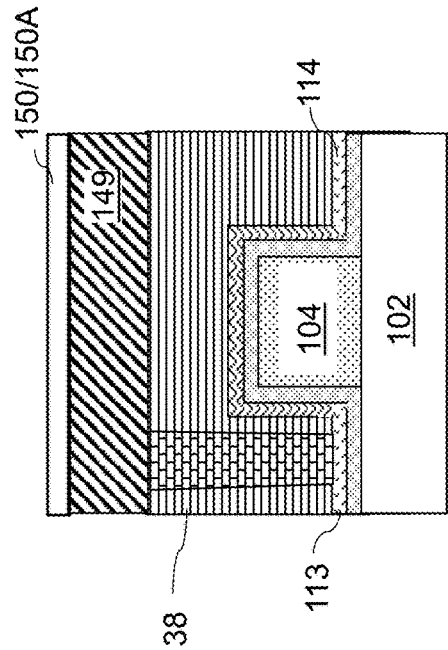
FIG. 10C is a vertical cross-sectional view through line BB' of FIG. 10A.
Figure 10B:
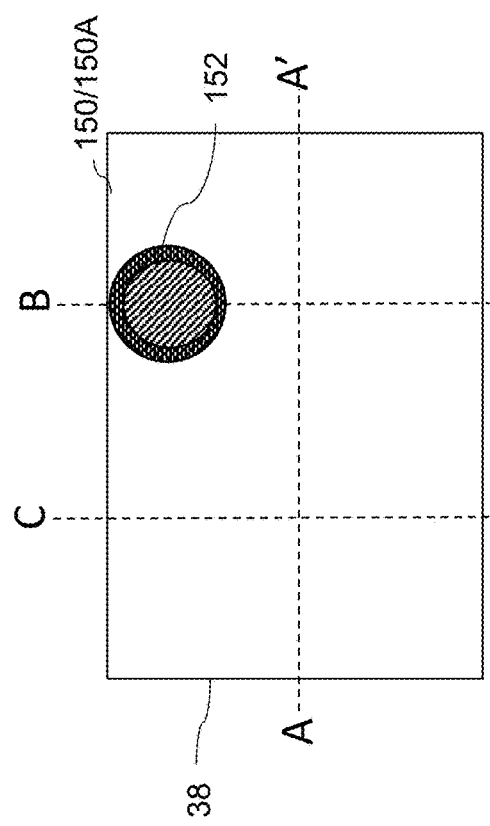
FIG. 10B is a vertical cross-sectional view through line AA' of FIG. 10A.
Figure 10D:
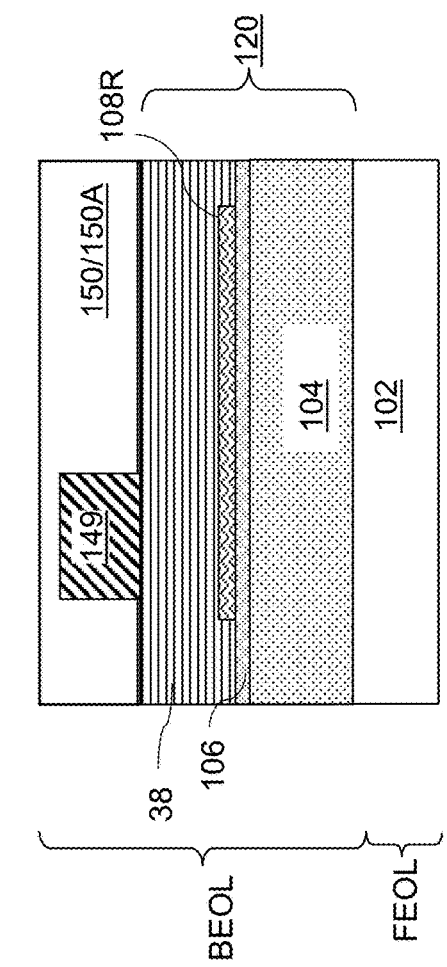
FIG. 10D is a vertical cross-sectional view through line CC' of FIG. 10A.

FIG. 10A is a top view of the exemplary structure after forming a drain contact, according to various embodiments of the present disclosure. FIG. 10B is a vertical cross-sectional view through line AA' of FIG. 10A, FIG. 10C is a vertical cross-sectional view through line BB' of FIG. 10A, and FIG. 10D is a vertical cross-sectional view through line CC' of FIG. 10A. Referring to FIG. 10A-10D, via cavities may be formed through the connection-via-level dielectric layer 150/150A. For example, a photoresist layer (not shown) may be applied over the connection-via-level dielectric layer 150/150A and may be patterned to form opening within areas of the memory array region 100 that overlie a respective one of the drain contacts 112 of the TFT 120. An anisotropic etch may be performed to transfer the pattern in the photoresist layer through the connection-via-level dielectric layer 150/150A. The via cavities formed by the anisotropic etch process are herein referred to as lower-electrode-contact via cavities because bottom electrode connection via structures of an MJT device 130 are subsequently formed in the lower-electrode-contact via cavities. The lower-electrode-contact via cavities may have tapered sidewalls having a taper angle (within respective to a vertical direction) in a range from 1 degree to 10 degrees. A top surface of a contact 112 may be physically exposed at the bottom of each lower-electrode-contact via cavity. The photoresist layer may be subsequently removed, for example, by ashing.

The metallic barrier layer may cover physically exposed top surfaces of the contact 112, tapered sidewalls of the lower-electrode-contact via cavities, and the top surface of the connection-via-level dielectric layer 150 without any hole therethrough. The metallic barrier layer may include a conductive metallic nitride such as TiN, TaN, and/or WN. Other suitable materials within the contemplated scope of disclosure may also be used. The thickness of the metallic barrier layer may be in a range from 3 nm to 20 nm, although lesser and greater thicknesses may also be used.

A metallic fill material such as tungsten or copper may be deposited in remaining volumes of the lower-electrode-contact via cavities. Portions of the metallic fill material and the metallic barrier layer that overlie the horizontal plane including the topmost surface of the connection-via-level dielectric layer 150 may be removed by a planarization process such as chemical mechanical planarization. Each remaining portion of the metallic fill material located in a respective via cavity comprises a metallic via fill material portion 152. Each remaining portion of the metallic barrier layer in a respective via cavity comprises a metallic barrier layer 151. Each combination of a metallic barrier layer 151 and a metallic fill material portion 152 that fills a via cavity constitutes a connection via structure (151, 152). An array of connection via structures (151, 152) may be formed in the connection-via-level dielectric layer 150 on underlying contacts 112.

Figure 11A:
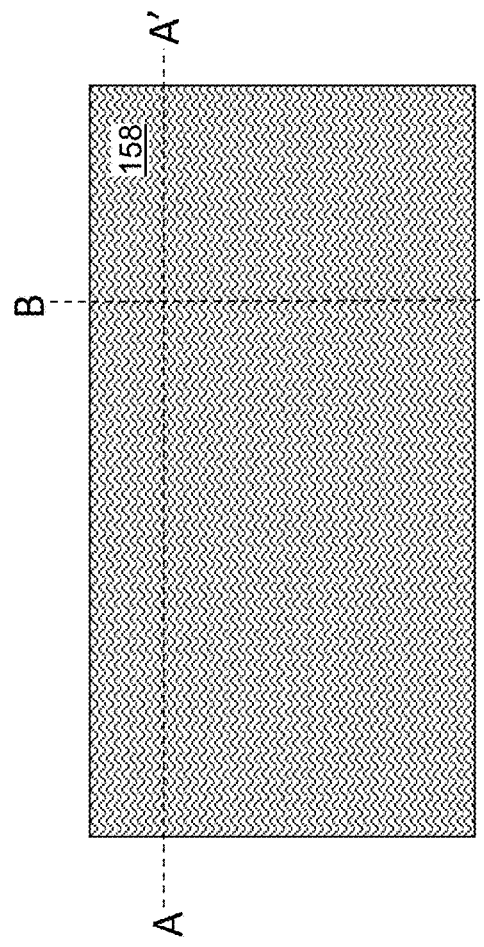
FIG. 11A is a top view of the exemplary structure after forming a layer stack including a bottom electrode material layer, a nonmagnetic metallic buffer material layer, a synthetic antiferromagnet layer, a nonmagnetic tunnel barrier material layer, a free magnetization material layer, a top electrode material layer, and a metallic etch mask material layer, according to an embodiment of the present disclosure.
Figure 11B:
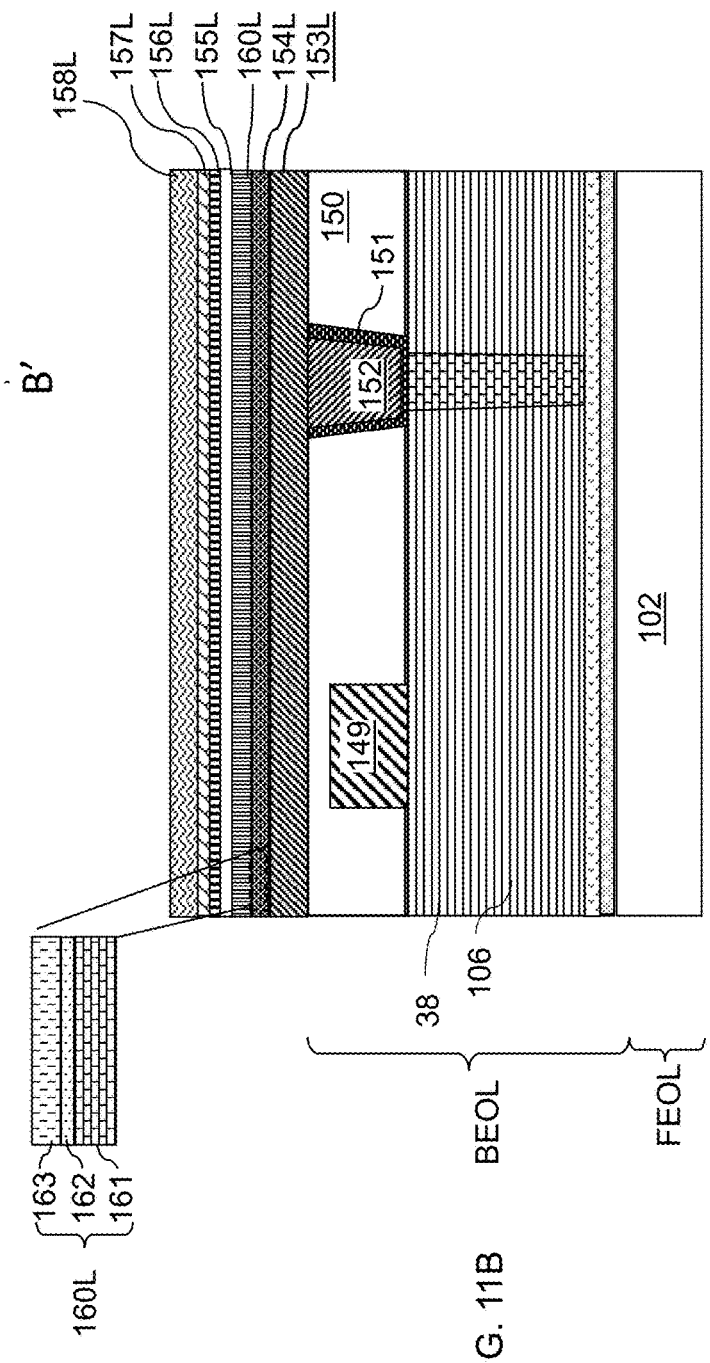
FIG. 11B is a vertical cross-sectional view through line AA' of FIG. 11A.

FIG. 11A is a top view of the exemplary structure after forming a layer stack including a bottom electrode material layer, a nonmagnetic metallic buffer material layer, a synthetic antiferromagnet layer, a nonmagnetic tunnel barrier material layer, a free magnetization material layer, a top electrode material layer, and a metallic etch mask material layer, according to an embodiment of the present disclosure. FIG. 11B is a vertical cross-sectional view through line AA' of FIG. 11A, and FIG. 11C is a vertical cross-sectional view through line BB' of FIG. 11A.

Figure 11C:
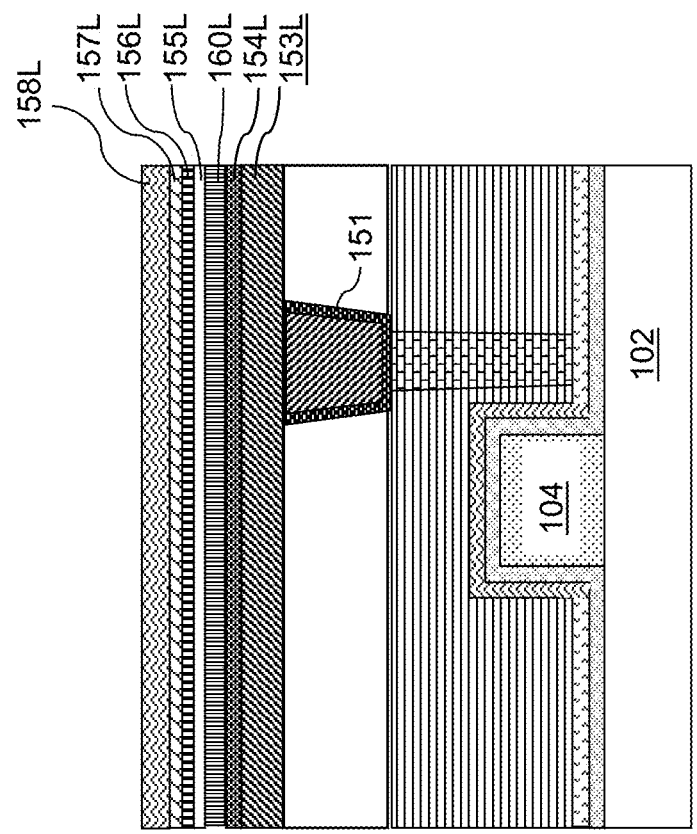
FIG. 11C is a vertical cross-sectional view through line BB' of FIG. 11A.

Referring to FIGS. 11A-11C, a layer stack including a bottom electrode material layer 153L, a nonmagnetic metallic buffer material layer 154L, a synthetic antiferromagnet layer 160L, a nonmagnetic tunnel barrier material layer 155L, a free magnetization material layer 156L, a top electrode material layer 157L, and a metallic etch mask material layer 158L may be formed over the metallic barrier layer and the metallic via fill material portions 152. The layers within the layer stack may be deposited by a respective chemical vapor deposition process or a respective physical vapor deposition process. Each layer within the layer stack may be deposited as planar blanket material layers having a respective uniform thickness throughout. The nonmagnetic metallic buffer material layer 154L, the synthetic antiferromagnet layer 160L, the nonmagnetic tunnel barrier material layer 155L, and the free magnetization material layer 156L are collectively referred to as memory material layers. In other words, memory material layers are formed between the bottom electrode material layer 153L and the top electrode material layer 157L.

While the present disclosure is described using an embodiment in which the memory material layers include the nonmagnetic metallic buffer material layer 154L, the synthetic antiferromagnet layer 160L, the nonmagnetic tunnel barrier material layer 155L, and the free magnetization material layer 156L, the methods and structures of the present disclosure may be applied to any structure in which the memory material layers include a different layer stack provided between a bottom electrode material layer 153L and a top electrode material layer 157L and include material layers that may store information in any manner. Modifications of the present disclosure are expressly contemplated herein in which the memory material layers include a phase change memory material, a ferroelectric memory material, or a vacancy-modulated conductive oxide material.

The bottom electrode material layer 153L includes at least one nonmagnetic metallic material such as TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the bottom electrode material layer 153L may include, and/or may consist essentially of, an elemental metal such as W, Cu, Ti, Ta, Ru, Co, Mo, or Pt. The thickness of the bottom electrode material layer 153L may be in a range from 10 nm to 100 nm, although lesser and greater thicknesses may also be used.

The nonmagnetic metallic buffer material layer 154L includes a nonmagnetic material that may function as a seed layer. Specifically, the nonmagnetic metallic buffer material layer 154L may provide a template crystalline structure that aligns polycrystalline grains of the materials of the synthetic antiferromagnet layer 160L along directions that maximizes the magnetization of a reference layer within the synthetic antiferromagnet layer 160L. The nonmagnetic metallic buffer material layer 154L may include Ti, a CoFeB alloy, a NiFe alloy, ruthenium, or a combination thereof. The thickness of the nonmagnetic metallic buffer material layer 154L may be in a range from 3 nm to 30 nm, although lesser and greater thicknesses may also be used.

The synthetic antiferromagnet (SAF) layer 160L may include a layer stack of a ferromagnetic hard layer 161, an antiferromagnetic coupling layer 162, and a reference magnetization layer 163. Each of the ferromagnetic hard layer 161 and the reference magnetization layer 163 may have a respective fixed magnetization direction. The antiferromagnetic coupling layer 162 provides antiferromagnetic coupling between the magnetization of the ferromagnetic hard layer 161 and the magnetization of the reference magnetization layer 163 so that the magnetization direction of the ferromagnetic hard layer 161 and the magnetization direction of the reference magnetization layer 163 remain fixed during operation of the memory cells to be subsequently formed. The ferromagnetic hard layer 161 may include a hard ferromagnetic material such as PtMn, IrMn, RhMn, FeMn, OsMn, etc. The reference magnetization layer 163 may include a hard ferromagnetic material such as Co, CoFe, CoFeB, CoFeTa, NiFe, CoPt, CoFeNi, etc. Other suitable materials within the contemplated scope of disclosure may also be used. The antiferromagnetic coupling layer 162 may include ruthenium or iridium. The thickness of the antiferromagnetic coupling layer 162 may be selected such that the exchange interaction induced by the antiferromagnetic coupling layer 162 stabilizes the relative magnetization directions of the ferromagnetic hard layer 161 and the reference magnetization layer 163 at opposite directions, i.e., in an antiparallel alignment. In one embodiment, the net magnetization of the SAF layer 160L is obtained by matching the magnitude of the magnetization of the ferromagnetic hard layer 161 with the magnitude of the magnetization of the reference magnetization layer 163. The thickness of the SAF layer 160L may be in a range from 5 nm to 30 nm, although lesser and greater thicknesses may also be used.

The nonmagnetic tunnel barrier material layer 155L may include a tunneling barrier material, which may be an electrically insulating material having a thickness that allows electron tunneling. For example, the nonmagnetic tunnel barrier material layer 146L may include magnesium oxide (MgO), aluminum oxide (Al2O3), aluminum nitride (AlN), aluminum oxynitride (AlON), hafnium oxide (HfO2) or zirconium oxide (ZrO2). Other suitable materials within the contemplated scope of disclosure may also be used. The thickness of the nonmagnetic tunnel barrier material layer 155L may be 0.7 nm to 1.3 nm, although lesser and greater thicknesses may also be used.

The free magnetization material layer 156L includes a ferromagnetic material having two stable magnetization directions that are parallel or antiparallel to the magnetization direction of the reference magnetization layer 163. The free magnetization material layer 156L includes a hard ferromagnetic material such as Co, CoFe, CoFeB, CoFeTa, NiFe, CoPt, CoFeNi, etc. Other suitable materials within the contemplated scope of disclosure may also be used. The thickness of the free magnetization material layer 156L may be in a range from 1 nm to 6 nm, although lesser and greater thicknesses may also be used.

The top electrode material layer 157L includes a top electrode material, which may include any nonmagnetic material that may be used for the bottom electrode material layer 153L. Exemplary metallic materials that may be used for the top electrode material layer 157L include, but are not limited to, TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the bottom electrode material layer 153L may include, and/or may consist essentially of, an elemental metal such as W, Cu, Ti, Ta, Ru, Co, Mo, or Pt. The thickness of the top electrode material layer 157L may be in a range from 10 nm to 100 nm, although lesser and greater thicknesses may also be used.

The metallic etch mask material layer 158L includes a metallic etch stop material that provides high resistance to an anisotropic etch process to be subsequently used to etch a dielectric material (which may include, for example, undoped silicate glass, a doped silicate glass, or organosilicate glass). In one embodiment, the metallic etch mask material layer 158L may include a conductive metallic nitride material (such as TiN, TaN, or WN) or a conductive metallic carbide material (such as TiC, TaC, or WC). In one embodiment, the metallic etch mask material layer 158L includes, and/or consists essentially of, TiN. The metallic etch mask material layer 158L may be deposited by chemical vapor deposition or physical vapor deposition. The thickness of the metallic etch mask material layer 158 may be in a range from 2 nm to 20 nm, such as from 3 nm to 10 nm, although lesser and greater thicknesses may also be used.

Figure 12A:
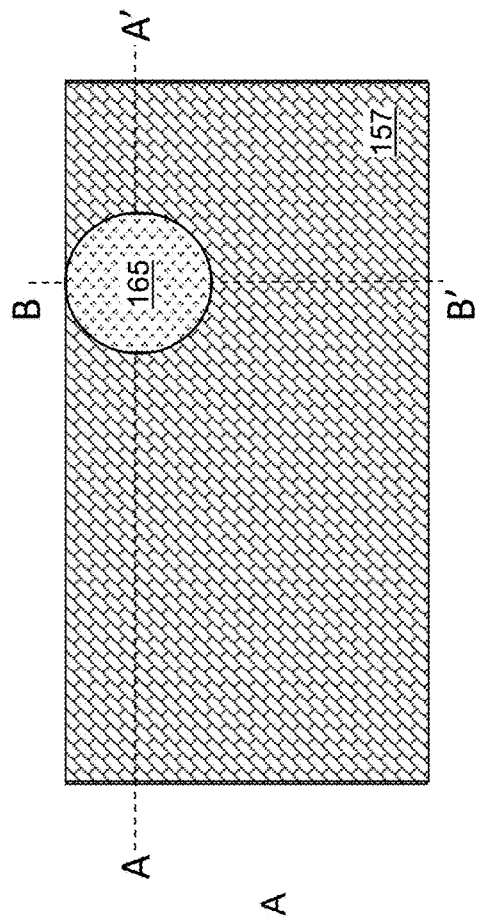
FIG. 12A is a top view of the exemplary structure after patterning the metallic etch mask material layer into metallic etch mask portions according to an embodiment of the present disclosure.
Figure 12B:
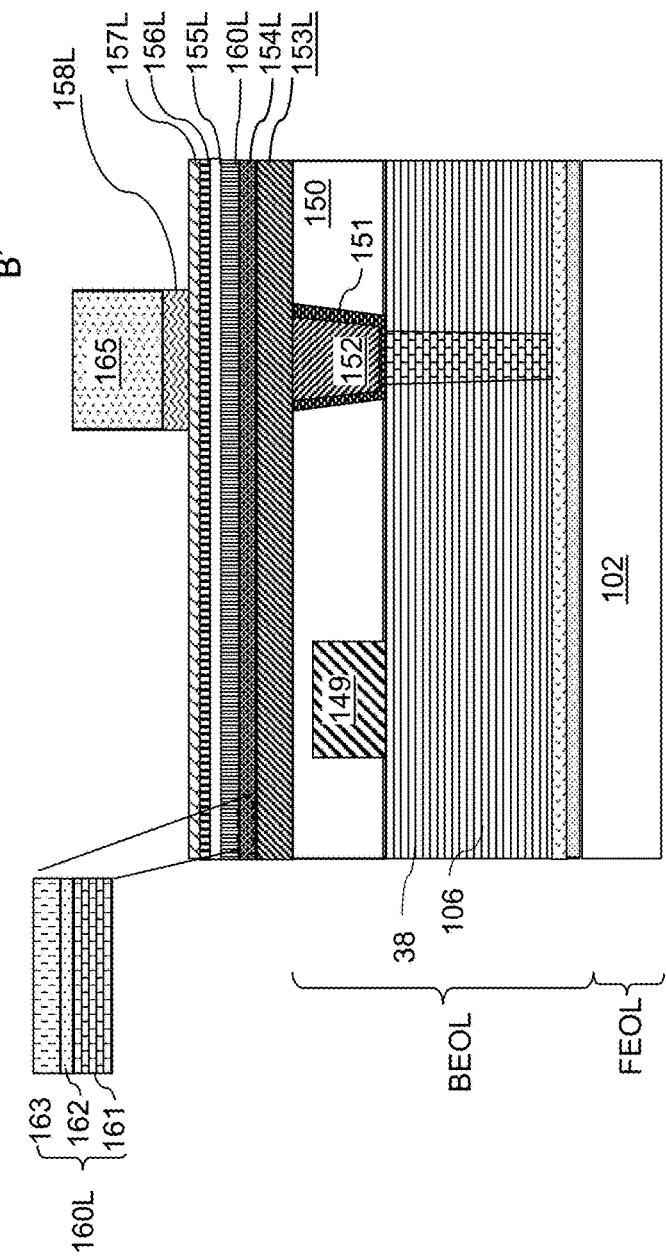
FIG. 12B is a vertical cross-sectional view through line AA' of FIG. 12A.

FIG. 12A is a top view of the exemplary structure after patterning the metallic etch mask material layer into metallic etch mask portions according to an embodiment of the present disclosure. FIG. 12B is a vertical cross-sectional view through line AA' of FIG. 12A, and FIG. 12C is a vertical cross-sectional view through line BB' of FIG. 12A.

Figure 12C:
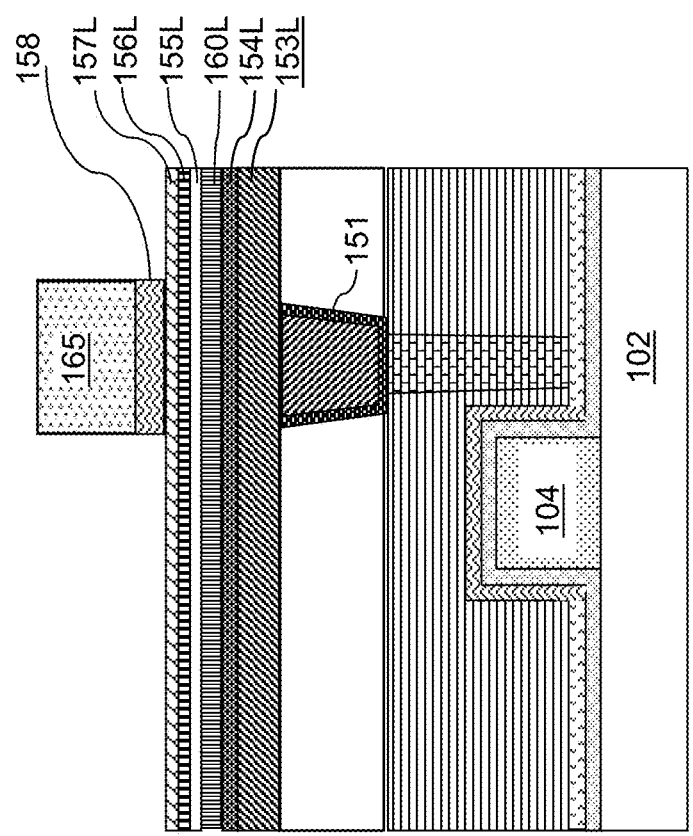
FIG. 12C is a vertical cross-sectional view through line BB' of FIG. 12A.

Referring to FIGS. 12A-12C, a photoresist layer 165 may be applied over the metallic etch mask material layer 158L and may be lithographically patterned to form an array of discrete photoresist material portions. Each discrete photoresist material portion in the array of discrete photoresist material portions may overlie a respective one of the connection via structures (151, 152). In one embodiment, the connection via structures (151, 152) may be arranged as a two-dimensional periodic array having a first pitch along a first horizontal direction and a second pitch along a second horizontal direction. The discrete photoresist material portions may be arranged as a two-dimensional periodic array having the same periodicity as the two-dimensional periodic array of the connection via structures (151, 152).

A first anisotropic etch process may be performed to etch unmasked regions of the metallic etch mask material layer 158L. The first anisotropic etch process uses the photoresist layer 165 as an etch mask, and patterned portions of the metallic etch mask material layer 158L comprise metallic etch mask portion 158. The first anisotropic etch process patterns the metallic etch mask material layer 158L into a two-dimensional array of metallic etch mask portions 158. The two-dimensional array of metallic etch mask portions 158 may replicate the pattern of the photoresist layer 165. The photoresist layer 165 may be removed after the first anisotropic etch process, or may remain on the two-dimensional array of metallic etch mask portions 158 during a subsequent second anisotropic etch process.

Figure 13:
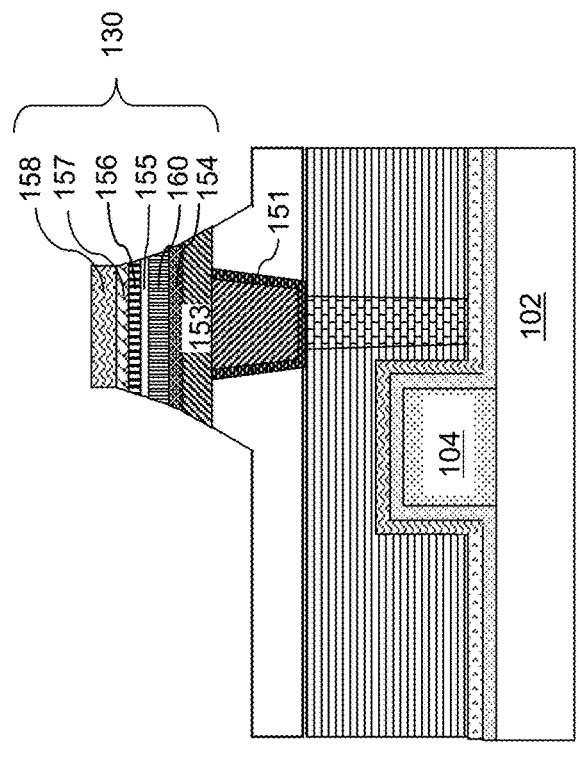
FIG. 13 is a vertical cross-sectional view of the exemplary structure after formation of an array of memory cells and an array of metallic etch stop portions according to an embodiment of the present disclosure.

FIG. 13 is a vertical cross-sectional view of the exemplary structure after formation of an array of memory cells 130 and an array of metallic etch stop portions according to an embodiment of the present disclosure. Referring to FIG. 13, a second anisotropic etch process may be performed to transfer the pattern of the two-dimensional array of metallic etch mask portions 158 through the layer stack including the top electrode material layer 157L, the free magnetization material layer 156L, the nonmagnetic tunnel barrier material layer 155L, the synthetic antiferromagnet layer 160L, the nonmagnetic metallic buffer material layer 154L, and the bottom electrode material layer 153L. Portions of the layer stack (157L, 156L, 155L, 160L, 154L, 153L) that are not masked by the metallic etch mask portions 158 are etched during the second anisotropic etch process. In embodiments in which the photoresist layer 165 is present at the beginning of the second anisotropic etch process, the photoresist layer 165 may be collaterally consumed during the second anisotropic etch process, and the metallic etch mask portions 158 may be used as an etch mask at least during pattering of the bottom electrode material layer 153L. Alternatively, in embodiments in which the photoresist layer 165 is removed prior to the second anisotropic etch process, the metallic etch mask portions 158 may be used as an etch mask throughout the second anisotropic etch process.

The second anisotropic etch process may include a series of anisotropic etch steps that sequentially etches the various material layers of the underlying layer stack. In one embodiment, patterned portions of the layer stack may include sidewalls having a non-zero taper angle, i.e., having a non-vertical surface. The taper angle may vary from layer to layer, and generally may be in a range from 3 degrees to 30 degrees, such as from 6 degrees to 20 degrees, although lesser and greater taper angles may also be used. Unmasked portions of the connection-via-level dielectric layer 150 may be vertically recessed by the second anisotropic etch process.

The layer stack (158L, 157L, 156L, 155L, 160L, 154L, 153L) of the metallic etch mask material layer 158L, the top electrode material layer 157L, the free magnetization material layer 156L, the nonmagnetic tunnel barrier material layer 155L, the synthetic antiferromagnet layer 160L, the nonmagnetic metallic buffer material layer 154L, and the bottom electrode material layer 153L may be patterned into an array of memory cells (153, 154, 160, 155, 156, 157) and an array of metallic etch mask portions 158. Each of the memory cells (153, 154, 160, 155, 156, 157) comprises a bottom electrode 153, a memory material stack (154, 160, 155, 156), and a top electrode 157. Each of the metallic etch mask portion 158 is a patterned portion of the metallic etch mask material layer 158L that overlies a respective one of the memory cells (153, 154, 160, 155, 156, 157).

In one embodiment, each memory cell (153, 154, 160, 155, 156, 157) may be a magnetic tunnel junction (MTJ) memory cell 130. Each MTJ memory cell 130 (153, 154, 160, 155, 156, 157) may include a bottom electrode 153, a magnetic tunnel junction structure (160, 155, 156), and a top electrode 157. Each magnetic tunnel junction structure (160, 155, 156) may include a synthetic antiferromagnet (SAF) structure 160, a nonmagnetic tunnel barrier layer 155, and a free magnetization layer 156. A nonmagnetic metallic buffer layer 154 may be provided between the bottom electrode 153 and the magnetic tunnel junction structure (160, 155, 156). Each bottom electrode 153 is a patterned portion of the bottom electrode material layer 153L. Each SAF structure 160 is a patterned portion of the SAF layer 160L. Each nonmagnetic tunnel barrier layer 155 is a patterned portion of the nonmagnetic tunnel barrier material layer 155L. Each free magnetization layer 156 is a patterned portion of the free magnetization material layer 156L. Each top electrode 157 is a patterned portion of the metallic etch mask material layer 158L. In one embodiment, the metallic etch mask portions 158 comprise, and/or consist essentially of, a conductive metallic nitride material (such as TiN, TaN, or WN), and each of the memory cells (153, 154, 160, 155, 156, 157) comprises a vertical stack including a synthetic antiferromagnet structure 160, a nonmagnetic tunnel barrier layer 155, and a free magnetization layer 156.

Figure 14:
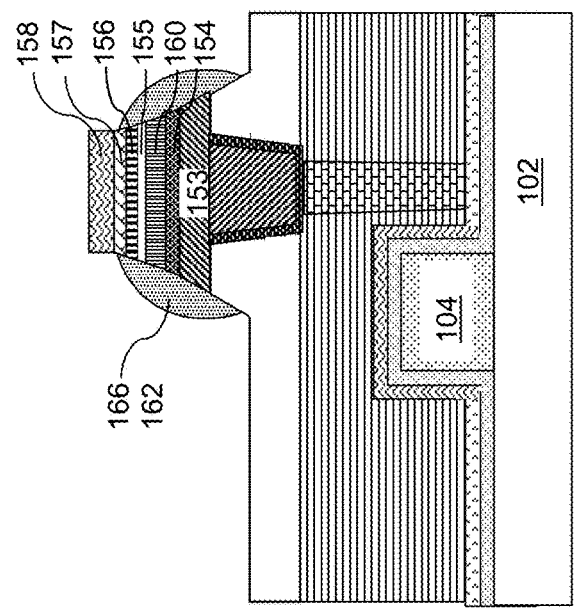
FIG. 14 is a vertical cross-sectional view of the exemplary structure after formation of an array of inner dielectric spacer portions according to an embodiment of the present disclosure.

FIG. 14 is a vertical cross-sectional view of the exemplary structure after formation of an array of inner dielectric spacer portions according to an embodiment of the present disclosure. Referring to FIG. 14, a first dielectric material such as silicon nitride may be conformally deposited over the array of memory cells (153, 154, 160, 155, 156, 157) and the array of metallic etch mask portions 158. For example, the first dielectric material may be deposited by a chemical vapor deposition process. The thickness of the first dielectric material over a horizontal surface may be in a range from 2 nm to 20 nm, such as from 4 nm to 10 nm, although lesser and greater thicknesses may also be used. An anisotropic etch process may be performed to remove horizontal portions of the first dielectric material. Remaining portions of the first dielectric material comprise an array of inner dielectric spacer portions 166 that laterally surrounds the array of memory cells (153, 154, 160, 155, 156, 157). In one embodiment, the duration of the anisotropic etch process may be selected such that sidewalls of the array of metallic etch mask portions 158 are partly or fully physically exposed. The maximum thickness of each inner dielectric spacer portion 166 may be in a range from 2 nm to 20 nm, such as from 4 nm to 10 nm, although lesser and greater thicknesses may also be used.

Figure 15:
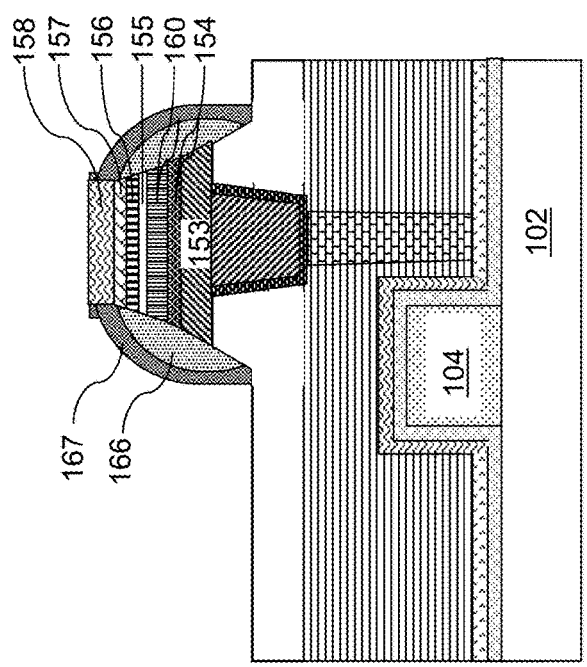
FIG. 15 is a vertical cross-sectional view of the exemplary structure after formation of an array of outer dielectric spacer portions according to an embodiment of the present disclosure.

FIG. 15 is a vertical cross-sectional view of the exemplary structure after formation of an array of outer dielectric spacer portions according to an embodiment of the present disclosure. Referring to FIG. 15, a second dielectric material such as a dielectric metal oxide may be conformally deposited over the array of inner dielectric spacer portions 166. For example, the second dielectric material may include aluminum oxide, hafnium oxide, lanthanum oxide, or yttrium oxide, and may be deposited by a chemical vapor deposition process. The thickness of the second dielectric material over a horizontal surface may be in a range from 2 nm to 20 nm, such as from 4 nm to 10 nm, although lesser and greater thicknesses may also be used. An anisotropic etch process may be performed to remove horizontal portions of the second dielectric material. Remaining portions of the second dielectric material comprise an array of outer dielectric spacer portions 167 that laterally surrounds the array of inner dielectric spacer portions 166. In one embodiment, the outer dielectric spacer portions 167 may be deposited directly on sidewalls of the metallic etch mask portions 158. In one embodiment, the entirety of each sidewall of the metallic etch mask portions 158 may contact a respective outer dielectric spacer portion 167. The maximum thickness of each outer dielectric spacer portion 167 may be in a range from 2 nm to 20 nm, such as from 4 nm to 10 nm, although lesser and greater thicknesses may also be used.

Each combination of an inner dielectric spacer portion 166 and an outer dielectric spacer portion 167 constitutes a dielectric spacer (166, 167). An array of dielectric spacers (166, 167) laterally surrounds the array of memory cells (153, 154, 160, 155, 156, 157) and the array of metallic etch mask portions 158. While the present disclosure is described using an embodiment in which a dielectric spacer (166, 167) includes an inner dielectric spacer portion 166 and an outer dielectric spacer portion 167, embodiments are expressly contemplated herein in which a dielectric spacer consists of an inner dielectric spacer portion 166 or consists of an outer dielectric spacer portion 167. Generally, a dielectric spacer (166, 167) may be formed around each metallic etch mask portion 158 within the array of metallic etch mask portions 158. Each dielectric spacer (166, 167) may be formed directly on, and around, a sidewall of a respective metallic etch mask portion 158.

Figure 16:
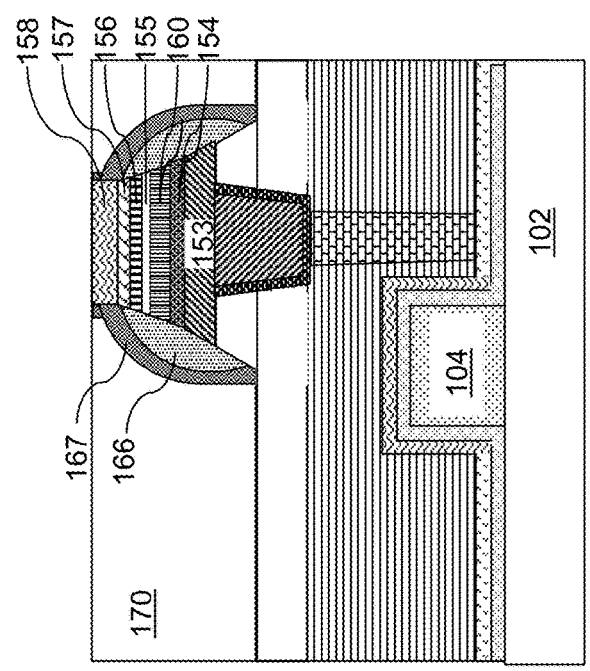
FIG. 16 is a vertical cross-sectional view of the exemplary structure after formation of a memory-level dielectric layer according to an embodiment of the present disclosure.

FIG. 16 is a vertical cross-sectional view of the exemplary structure after formation of a memory-level dielectric layer according to an embodiment of the present disclosure. Referring to FIG. 16, a memory-level dielectric layer 170 may be formed around the array of dielectric spacers (166, 167). The memory-level dielectric layer 170 includes a planarizable dielectric material such as undoped silicate glass or a doped silicate glass. The dielectric material of the memory-level dielectric layer 170 may be deposited by a conformal deposition process (such as a chemical vapor deposition process) or a self-planarizing deposition process (such as spin coating). A chemical mechanical planarization process may be performed to remove portions of the deposited dielectric material from above the horizontal plane including the top surfaces of the metallic etch mask portions 158. Various planarization assist structures (not shown) such as electrically isolated patterned portions of the metallic etch mask material layer 158L and underlying material layers may be used in the logic region 200 to assist planarization of the deposited dielectric material. Remaining portions of the deposited dielectric material after the planarization process constitute the memory-level dielectric layer 170. The top surface of the memory-level dielectric layer 170 may be within the same horizontal plane as the top surfaces of the metallic etch mask portions 158. In one embodiment, top surfaces of the dielectric spacers (166, 167), such as the top surfaces of the outer dielectric spacer portions 167, may be within the same horizontal plane as the top surface of the memory-level dielectric layer 170.

Figure 17:
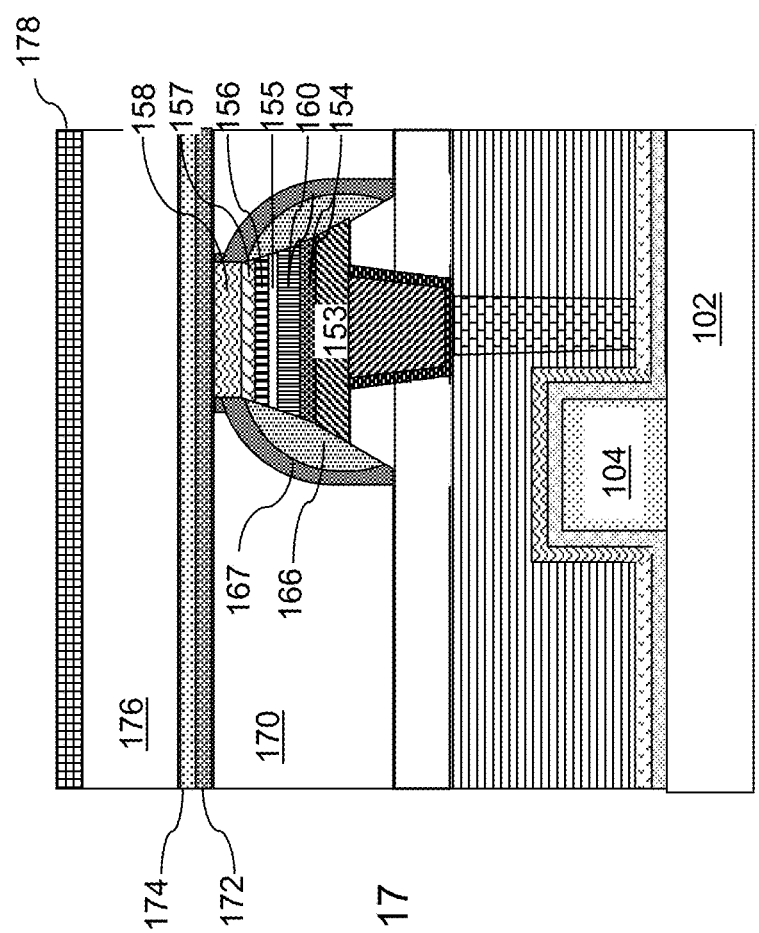
FIG. 17 is a vertical cross-sectional view of the exemplary structure after formation of dielectric etch stop layers and a via-level dielectric layer according to an embodiment of the present disclosure.

FIG. 17 is a vertical cross-sectional view of the exemplary structure after formation of dielectric etch stop layers and a via-level dielectric layer according to an embodiment of the present disclosure. Referring to FIG. 17, a first dielectric etch stop layer 172 and a second dielectric etch stop layer 174 may be sequentially deposited over the memory-level dielectric layer 170. The first dielectric etch stop layer 172 includes a dielectric material that is different from the dielectric material of the memory-level dielectric layer 170. In one embodiment, the memory-level dielectric layer 170 may include a silicon oxide-based dielectric material such as undoped silicate glass or a doped silicate glass, and the first dielectric etch stop layer 172 may include a silicon-containing dielectric material such as silicon nitride, silicon oxynitride, silicon carbide, or silicon carbide nitride. The first dielectric etch stop layer 172 may be deposited by a conformal or non-conformal deposition process. In one embodiment, the first dielectric etch stop layer 172 may be formed by chemical vapor deposition, atomic layer deposition, or physical vapor deposition. The thickness of the first dielectric etch stop layer 172 may be in a range from 2 nm to 20 nm, such as from 3 nm to 12 nm, although lesser and greater thicknesses may also be used.

The second dielectric etch stop layer 174 includes a dielectric material that is different from the dielectric material of the first dielectric etch stop layer 172. In one embodiment, the second dielectric etch stop layer 174 may include a dielectric metal oxide material such as aluminum oxide, hafnium oxide, titanium oxide, tantalum oxide, yttrium oxide, and/or lanthanum oxide. The second dielectric etch stop layer 174 may be deposited by a conformal or non-conformal deposition process. In one embodiment, the second dielectric etch stop layer 174 may be formed by chemical vapor deposition, atomic layer deposition, or physical vapor deposition. The thickness of the second dielectric etch stop layer 174 may be in a range from 2 nm to 20 nm, such as from 3 nm to 12 nm, although lesser and greater thicknesses may also be used.

The first dielectric etch stop layer 172 and the second dielectric etch stop layer 174 may be subsequently patterned so that the first dielectric etch stop layer 172 and the second dielectric etch stop layer 174 remain in the memory array region 100 and are removed from the logic region 200. For example, a photoresist layer (not shown) may be applied over the second dielectric etch stop layer 174 and may be lithographically patterned to cover the memory array region 100 without covering the logic region 200. Etch processes (such as wet etch processes) may be performed to etch unmasked portions of the first dielectric etch stop layer 172 and the second dielectric etch stop layer 174. The photoresist layer may be subsequently removed, for example, by ashing.

A via-level dielectric layer 176 may be formed above the dielectric etch stop layers (172, 174). The via-level dielectric layer 176 includes a dielectric material such as undoped silicate glass, a doped silicate glass, or organosilicate glass. The dielectric material of the via-level dielectric layer 176 may be deposited by a conformal deposition process (such as a chemical vapor deposition process) or a self-planarizing deposition process (such as spin coating). The thickness of the via-level dielectric layer 176 in the memory array region 100 may be in a range from 50 nm to 300 nm, such as from 80 nm to 200 nm, although lesser and greater thicknesses may also be used.

A via-level metallic etch mask layer 178 may be formed over the via-level dielectric layer 176. The via-level metallic etch mask layer 178 includes a metallic material that may function as an etch mask in subsequent anisotropic etch processes. For example, the via-level metallic etch mask layer 178 may include a conductive metallic nitride material (such as TiN, TaN, or WN) or a conductive metallic carbide material (such as TiC, TaC, or WC). In one embodiment, the via-level metallic etch mask layer 178 includes the same material as the metallic etch mask portions 158. In one embodiment, the via-level metallic etch mask layer 178 and the metallic etch mask portions 158 comprise, and/or consist essentially of, titanium nitride. The via-level metallic etch mask layer 178 may be formed by chemical vapor deposition or physical vapor deposition. The via-level metallic etch mask layer 178 may have a thickness in a range from 2 nm to 20 nm, such as from 3 nm to 10 nm, although lesser and greater thicknesses may also be used.

Figure 18:
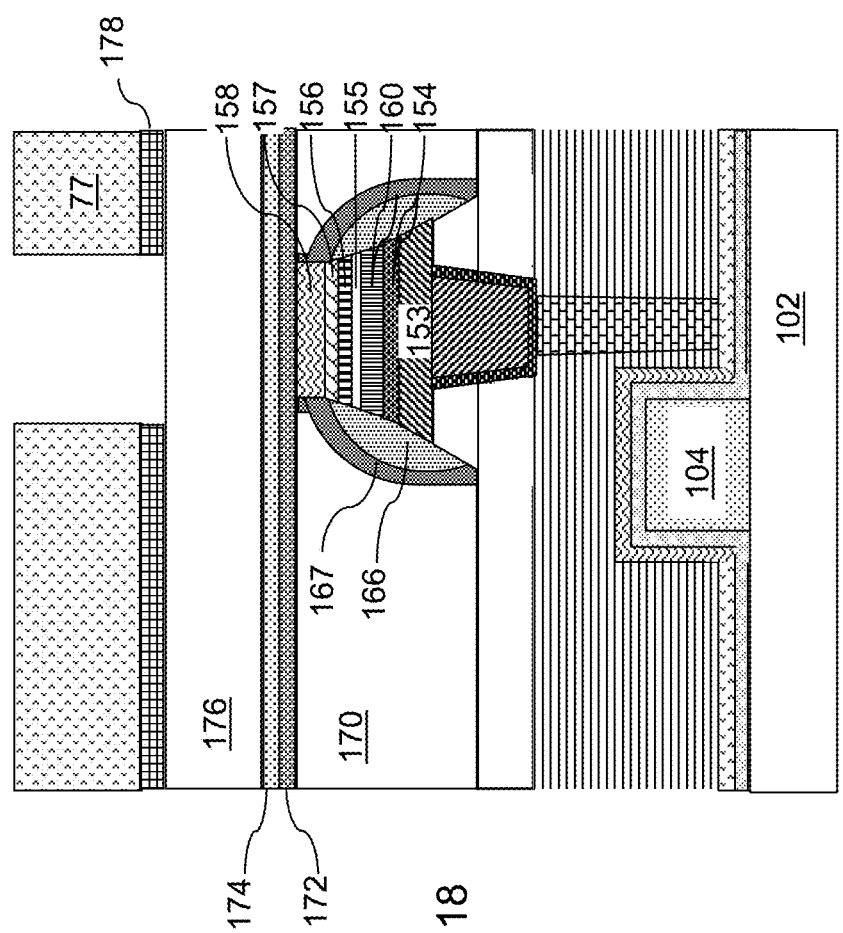
FIG. 18 is a vertical cross-sectional view of the exemplary structure after deposition and patterning of a via-level metallic etch mask layer according to an embodiment of the present disclosure.

FIG. 18 is a vertical cross-sectional view of the exemplary structure after deposition and patterning of a via-level metallic etch mask layer according to an embodiment of the present disclosure. Referring to FIG. 18, a photoresist layer 77 may be applied over the via-level metallic etch mask layer 178, and may be lithographically patterned to form an array of openings in areas that overlie the array of metallic etch mask portions 158. The area of each opening in the photoresist layer 77 may be greater than, less than, or the same as, the area of an underlying metallic etch mask portion 158. The periphery of each opening in the photoresist layer 77 may be located outside the sidewall of an underlying metallic etch mask portion 158, may be located inside the sidewall of the underlying metallic etch mask portion 158, or may coincide with the sidewall of the underlying metallic etch mask portion 158 in a plan view, i.e., a view along a vertical direction. Additional openings may be formed in the photoresist layer 77 within the logic region 200.

An etch process may be performed to transfer the pattern in the photoresist layer 77 through the via-level metallic etch mask layer 178. The etch process may include an anisotropic etch process or an isotropic etch process. In one embodiment, an anisotropic etch process such as a reactive ion etch process may be performed to transfer the pattern in the photoresist layer 77 through the via-level metallic etch mask layer 178. The photoresist layer 77 may be subsequently removed, for example, by ashing.

Figure 19:
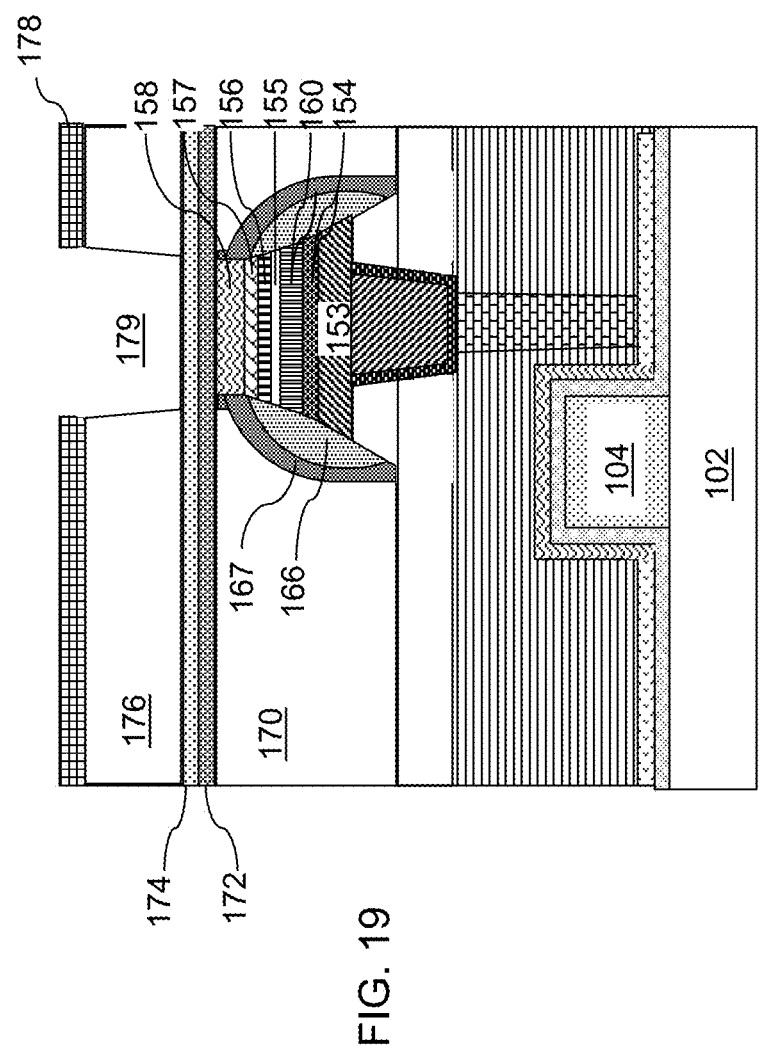
FIG. 19 is a vertical cross-sectional view of the exemplary structure after formation of an array of via cavities according to an embodiment of the present disclosure.

FIG. 19 is a vertical cross-sectional view of the exemplary structure after formation of an array of via cavities according to an embodiment of the present disclosure. Referring to FIG. 19, a first anisotropic etch process may be performed using the via-level metallic etch mask layer 178 as an etch mask. The first anisotropic etch process may comprise a reactive ion etch process that etches the dielectric material of the via-level dielectric layer 176, the memory-level dielectric layer 170, and the connection-via-level dielectric layer 150 selective to the materials of the second dielectric etch stop layer 174. In one embodiment, the via-level dielectric layer 176, the memory-level dielectric layer 170, and the connection-via-level dielectric layer 150 may include silicon oxide-based dielectric materials such as undoped silicate glass, a doped silicate glass, or organosilicate glass, and the first anisotropic etch process may include a reactive ion etch process that etches the silicon oxide-based dielectric material selective to the dielectric materials of the second dielectric etch stop layer 174.

Via cavity 179 may be formed underneath the opening through the via-level metallic etch mask layer 178. Specifically, via cavity 179 vertically extending through the via-level dielectric layer 176 may be formed in the memory array region 100. A top surface of the second dielectric etch stop layer 174 may be physically exposed at the bottom of each via cavity 179. An array of via cavities 179 may be formed over the array of memory cells (153, 154, 160, 155, 156, 157).

In one embodiment, each via cavity 179 as formed through the via-level dielectric layer 176 may have a greater lateral extent than the lateral extent of each metallic etch mask portion 158. In one embodiment, each metallic etch mask portion 158 may have a circular horizontal cross-sectional shape, an elliptical horizontal cross-sectional shape, a rectangular horizontal cross-sectional shape, or a horizontal cross-sectional shape of a rounded rectangle. In this embodiment, each via cavity 179 may have a horizontal cross-sectional shape that is a magnification of the horizontal cross-sectional shape of one of the metallic etch mask portions 158. In an illustrative example, the maximum lateral dimension of each via cavity 179 may be in a range from 100.1% to 150% of the maximum lateral dimension of one of the metallic etch mask portions 158.

Figure 20:
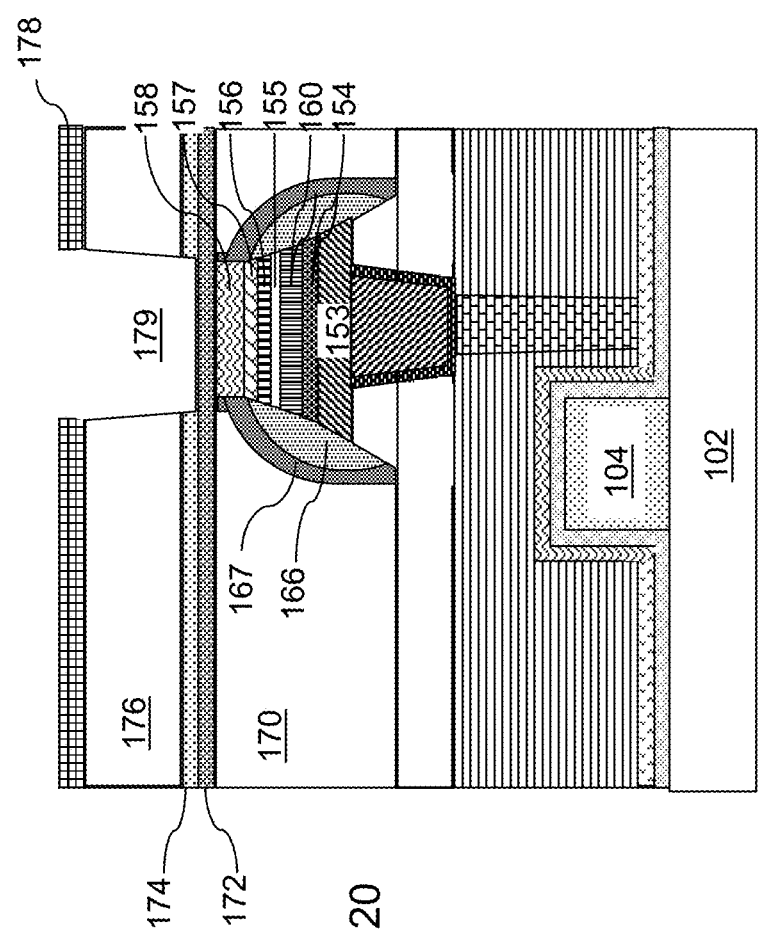
FIG. 20 is a vertical cross-sectional view of the exemplary structure after etching through physically exposed portions of a second dielectric etch stop layer according to an embodiment of the present disclosure.

FIG. 20 is a vertical cross-sectional view of the exemplary structure after etching through physically exposed portions of a second dielectric etch stop layer according to an embodiment of the present disclosure. Referring to FIG. 20, the via cavities 179 may be vertically extended by etching physically exposed portions of the second dielectric etch stop layer 174. For example, a first wet etch process may be performed to remove physically exposed portions of the second dielectric etch stop layer 174. For example, if the second dielectric etch stop layer 174 includes a dielectric metal oxide material, a wet etch process that etches the dielectric metal oxide material selective to the dielectric materials of the via-level dielectric layer 176 and the first dielectric etch stop layer 172 may be performed.

Figure 21:
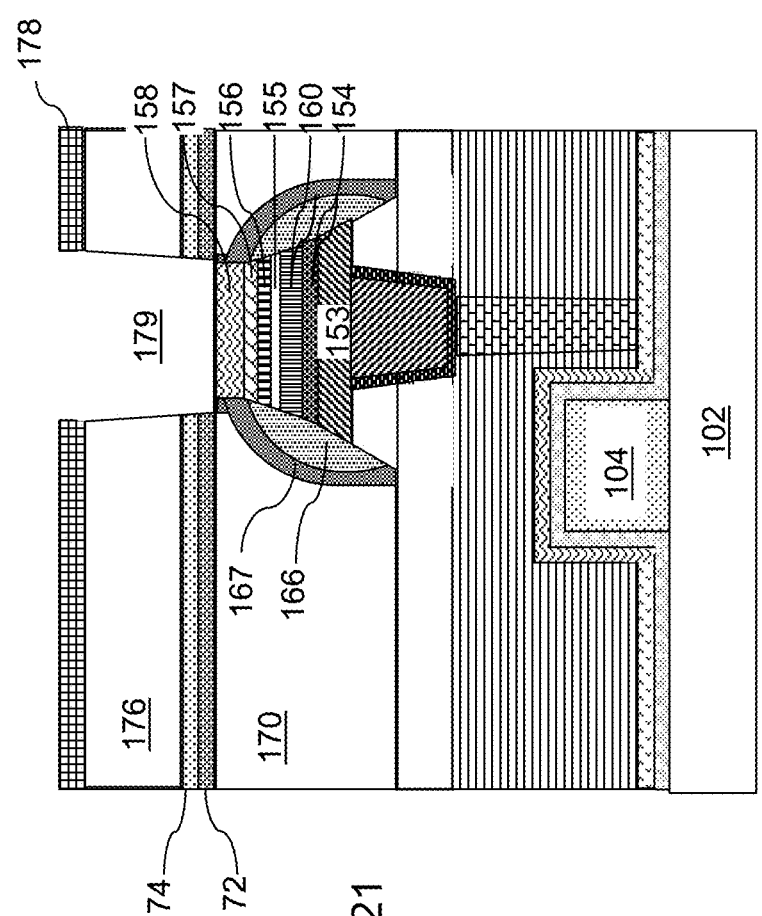
FIG. 21 is a vertical cross-sectional view of the exemplary structure after etching a top electrode contact via in portions of a first dielectric etch stop layer according to an embodiment of the present disclosure.

FIG. 21 is a vertical cross-sectional view of the exemplary structure after etching through physically exposed portions of a first dielectric etch stop layer according to an embodiment of the present disclosure. Referring to FIG. 21, the via cavity 179 may be vertically extended by etching physically exposed portions of the first dielectric etch stop layer 172. For example, a second anisotropic etch process may be performed to remove physically exposed portions of the first dielectric etch stop layer 172 using the via-level metallic etch mask layer 178. The chemistry of the second anisotropic etch process may be selective to the materials of the metallic etch mask portions 158, the outer dielectric spacer portions 167, and the memory-level dielectric layer 170. For example, the first dielectric etch stop layer 172 may include silicon nitride, and the second anisotropic etch process may include a reactive ion etch process that etches silicon nitride selective to the dielectric materials of the outer dielectric spacer portions 167 and the memory-level dielectric layer 170 and selective to the metallic material of the metallic etch mask portions 158. In an illustrative example, the second anisotropic etch process may include a reactive ion etch process using HBr, $CF_4$, $O_2$, $N_2$, $CH_xF_y$, Ar, and/or He as process gases.

The via cavity 179 vertically extends through the via-level dielectric layer 176 and the dielectric etch stop layers (172, 174), and sidewalls of the dielectric etch stop layers (172, 174) are physically exposed around each via cavity 179. Top surfaces of the metallic etch mask portions 158 may be physically exposed underneath the array of first via cavities 179. In one embodiment, the array of via cavity 179 may be formed as a two-dimensional periodic array.

Figure 22:
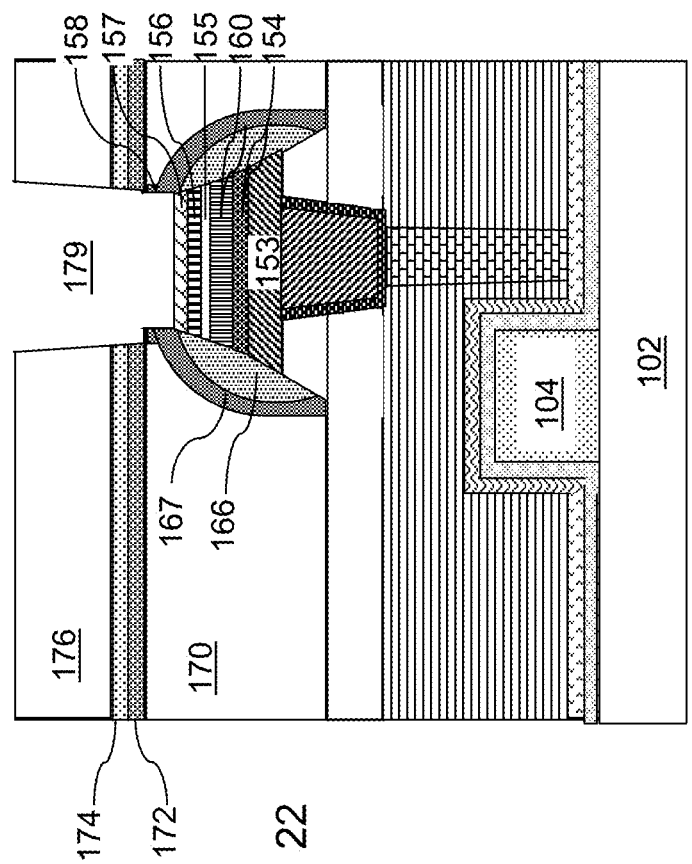
FIG. 22 is a vertical cross-sectional view of the exemplary structure after removal of metallic etch mask portions according to an embodiment of the present disclosure.

FIG. 22 is a vertical cross-sectional view of the exemplary structure after removal of metallic etch mask portions according to an embodiment of the present disclosure. Referring to FIG. 22, an etch process may be performed to etch the metallic materials of the metallic etch mask portions 158 and the via-level metallic etch mask layer 178. The etch process may include an isotropic etch process. For example, a second wet etch process may be performed to remove the metallic etch mask portions 158 and the via-level metallic etch mask layer 178. In embodiments in which the metallic etch mask portions 158 and the via-level metallic etch mask layer 178 include titanium nitride, a wet etch process for etching the metallic etch mask portions 158 and the via-level metallic etch mask layer 178 may include a combination of nitric acid and hydrofluoric acid, or SC1 solution (a combination of ammonium hydroxide, hydrogen peroxide, and water). The metallic etch mask portions 158 and the via-level metallic etch mask layer 178 may be simultaneously removed by the second wet etch process.

Generally, the metallic etch mask portions 158 may be removed selective to the materials of the top electrodes 157, the outer dielectric spacer portions 167, the memory-level dielectric layer 170, and the via-level dielectric layer 176. In other words, the etch process may be a selective etch process. In one embodiment, the array of metallic etch mask portions 158 and the via-level metallic etch mask layer 178 may comprise a same conductive metallic nitride material, and may be simultaneously removed by the etch process, which may be wet etch process. Top surfaces of the top electrodes 157 may be physically exposed underneath the array of first via cavities 179. In one embodiment, an inner sidewall of each dielectric spacer (166, 167) may be physically exposed upon removal of the array of metallic etch mask portions 158.

In one embodiment, each via cavity 179 may have an upper portion that is laterally surrounded by the dielectric etch stop layers (172, 174) and the via-level dielectric layer 176, and a downward-protruding portion that is laterally surrounded by a respective dielectric spacer (166, 167). In one embodiment, the downward-protruding portion may have a lesser lateral dimension than the upper portion of each first via cavity 179. In this embodiment, a horizontal top surface of a dielectric spacer (166, 167) and optionally a horizontal top surface of the memory-level dielectric layer 170 may be physically exposed to each first via cavity 179.

Figure 23A:
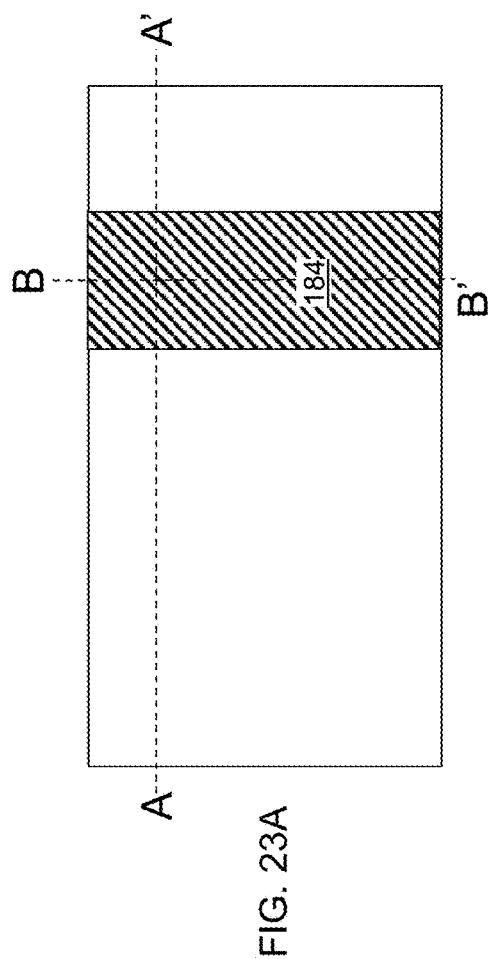
FIG. 23A is a top schematic view of the exemplary structure after deposition of a metallic barrier layer and a metallic fill material layer in, and over, the via cavities according to an embodiment of the present disclosure.
Figure 23B:
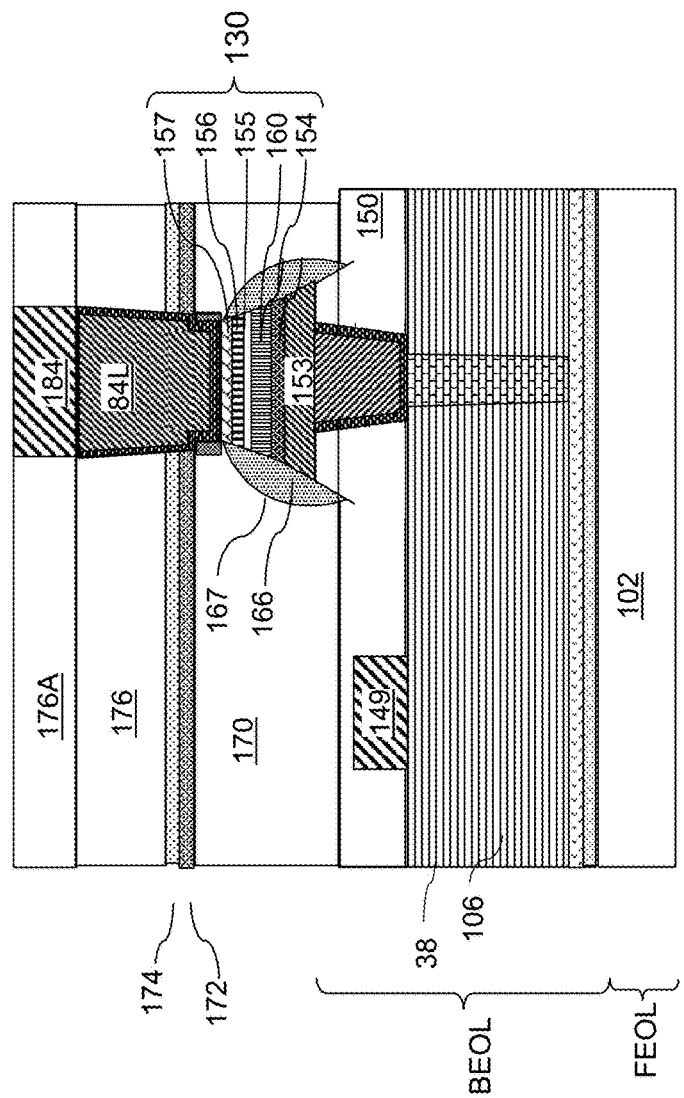
FIG. 23B is a vertical cross-sectional view through line AA' of FIG. 23A.

FIG. 23A is a top view of the exemplary structure after deposition of a metallic barrier layer and a metallic fill material layer in, and over, the via cavities according to an embodiment of the present disclosure. FIG. 23B is a vertical cross-sectional view through line AA' of FIG. 23A, and FIG. 23C is a vertical cross-sectional view through line BB' of FIG. 23A.

Figure 23C:
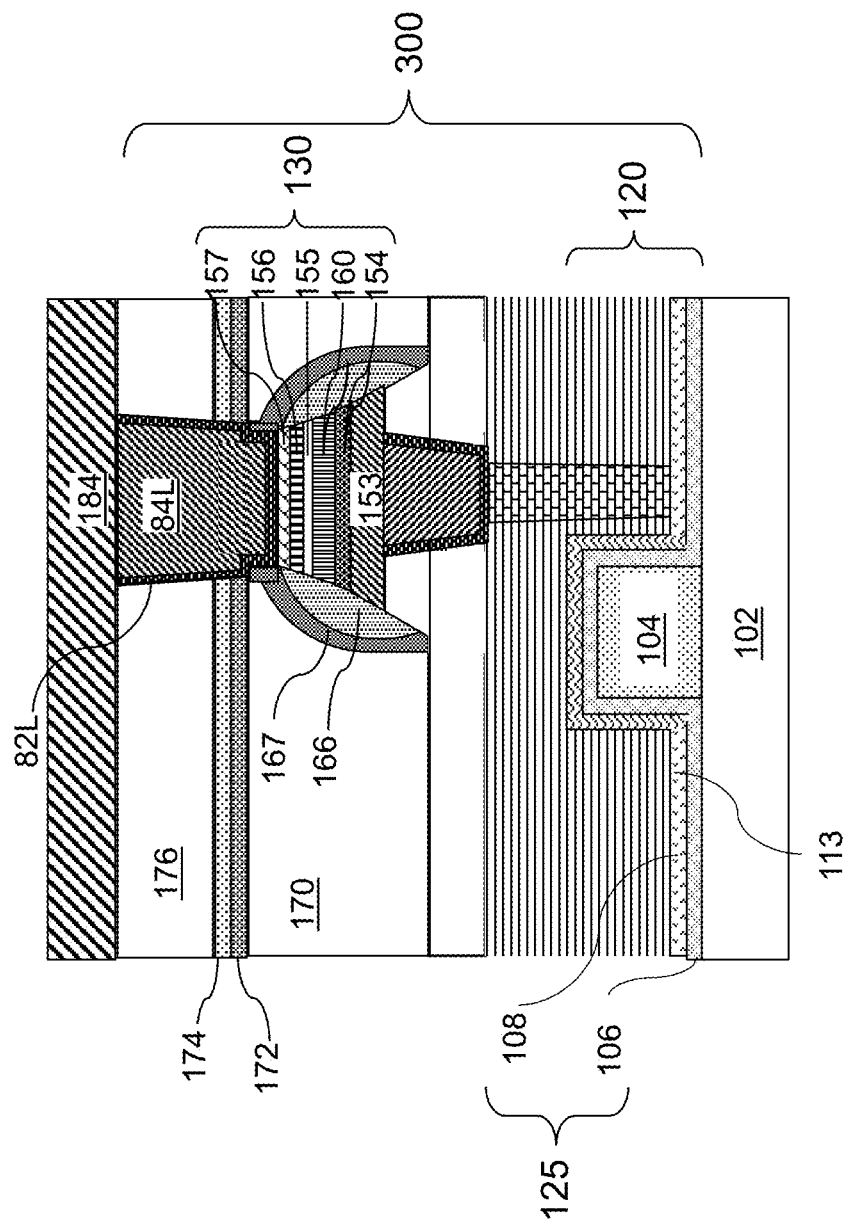
FIG. 23C is a vertical cross-sectional view through line BB' of FIG. 23A.

Referring to FIGS. 23A-23C, a metallic barrier layer 82L and a metallic fill material layer 84L may be sequentially deposited in via cavity 179. The metallic barrier layer 82L includes a metallic barrier material, i.e., a metallic material that functions as a diffusion barrier. Further, the material of the metallic barrier layer 82L may enhance adhesion of the metallic fill material layer 84L to the dielectric surfaces around the via cavity 179. In one embodiment, the metallic barrier layer 82L may include a metallic nitride material such as TiN, TaN, or WN. Generally, metallic nitride materials have higher resistivity than elemental metals or intermetallic alloy of at least two elemental metals. Thus, the thickness of the metallic barrier layer 82L may be selected at a minimum level provided that the metallic barrier layer 82L provides sufficient adhesion properties and diffusion barrier properties. The thickness of the vertically extending portions of the metallic barrier layer 82L may be in a range from 2 nm to 12 nm, such as from 3 nm to 6 nm, although lesser and greater thicknesses may also be used. The metallic barrier layer 82L may be deposited by chemical vapor deposition or physical vapor deposition. The metallic barrier layer 82L directly contacts top surfaces of the top electrodes 158. As such, there is no intervening metallic barrier material between the metallic barrier layer 82L and the top electrodes 157.

The metallic fill material layer 84L includes a metallic material that provides high electrical conductivity. For example, the metallic fill material layer 84L may include an elemental metal or an intermetallic alloy of at least two elemental metals. In one embodiment, the metallic fill material layer 84L may include W, Cu, Co, Ru, Mo, Al, alloys thereof, and/or a layer stack thereof. Other suitable materials within the contemplated scope of disclosure may also be used. The metallic fill material layer 84L may be deposited by physical vapor deposition, chemical vapor deposition, electroplating, and/or electroless plating. A bit line 184 may be formed over the metallic fill material layer 84L.

In various embodiments, the combination of at least one memory cell 130 stacked over the TFT 120, and the TFT 120 may be referred to as a memory structure 300, with the TFT 120 acting as the memory device selector. In some embodiments, the TFT 120 may be referred to as including a selector layer 125 comprising the high-k layer 106 and the channel layer 108. The selector layer 125 may operate to control current flow to the memory cell 130.

In some embodiments, the memory structure 300 may include multiple memory cells 130 connected to a single selector layer 125, with the selector layer 125 being configured to control current flow to each memory cell 130 connected thereto.

Figures 24A, 24B:
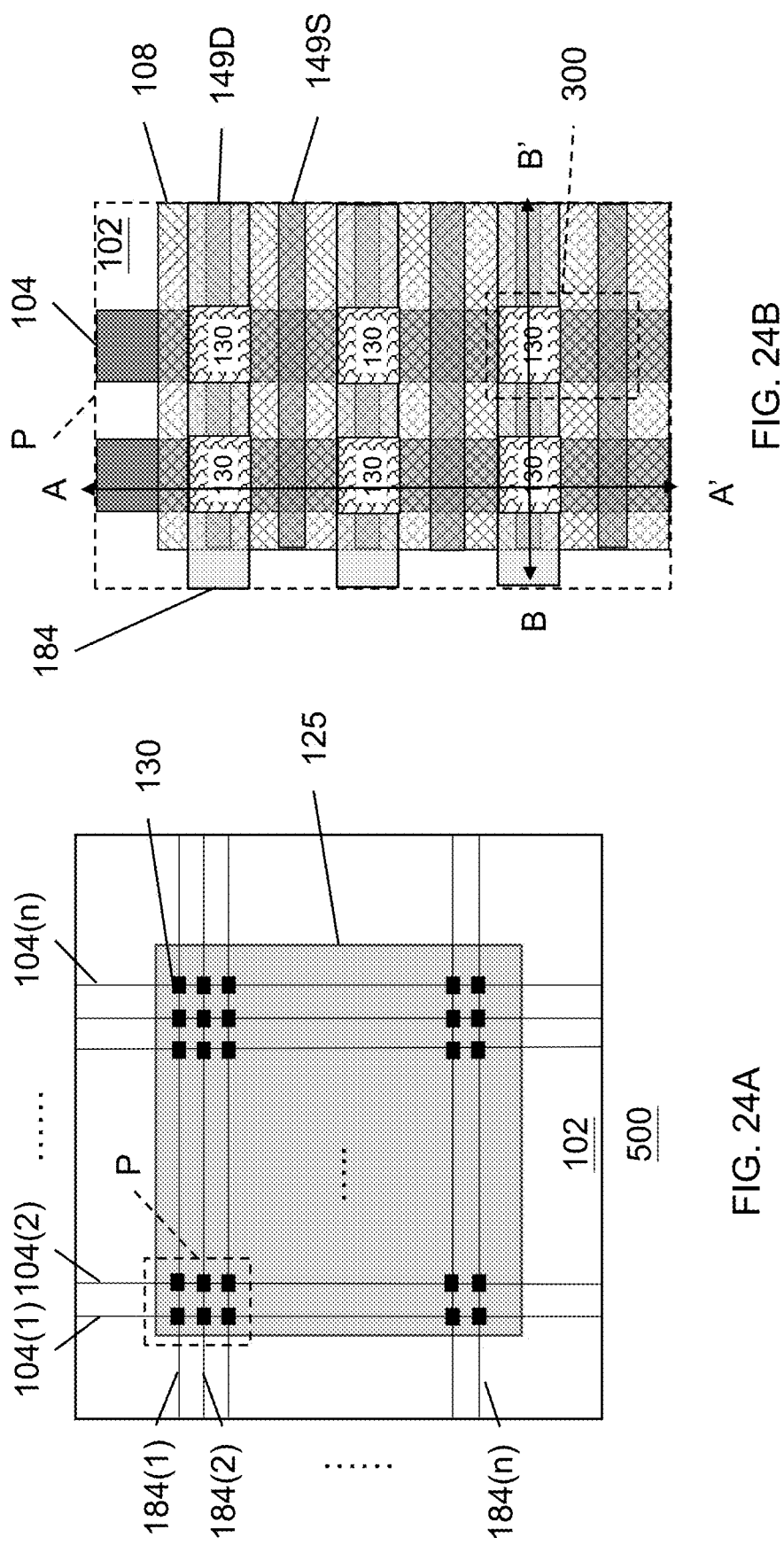
FIG. 24A is a top schematic view of a memory device, according to various embodiments of the present disclosure.
FIG. 24B is an enlarged simplified view of a portion P of FIG. 24A.
Figure 24C:
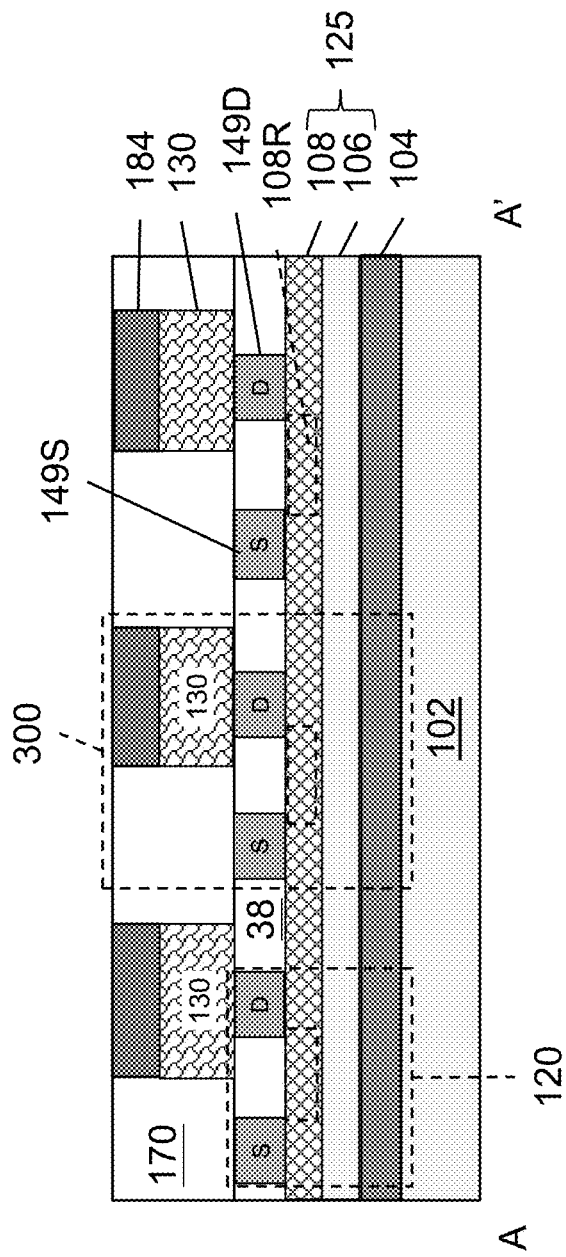
FIG. 24C is a cross-sectional view taken though line AA' of FIG. 24B.
Figure 24D:
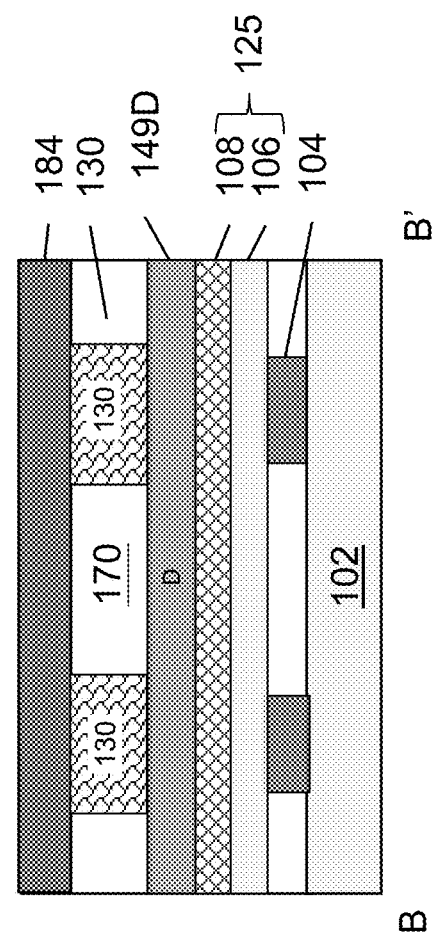
FIG. 24D is a cross-sectional view taken though line BB' of FIG. 24B.

FIG. 24A is a top schematic view of a memory device 500, according to various embodiments of the present disclosure. FIG. 24B is an enlarged plan view of a portion P of FIG. 24A with transparent layers to illustrate the location of elements in relation to each other, FIG. 24C is a cross-sectional view taken though line AA' of FIG. 24B, and FIG. 24D is a cross-sectional view taken though line BB' of FIG. 24B.

Referring to FIGS. 24A-24D, the memory array device 500 may include an array of memory structures 300. Each memory structure 300 may include, for example, the memory structure 300 shown in FIG. 22 or the simplified memory structures shown in FIGS. 23B and 23C. As discussed above, the memory structures 300 may be formed on a substrate 102 in a BEOL.

The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, the substrate 102 may include structures formed during a FEOL process, such as doped regions, interlayer dielectric (ILD) layers, conductive features, and/or isolation structures. Furthermore, the substrate 102 may further include single or multiple material layers to be patterned. For example, the material layers may include a silicon layer, a dielectric layer, and/or a doped poly-silicon layer. In some embodiments, the substrate 102 includes active components or circuits, such as transistors, conductive features, implantation regions, resistors, capacitors, and other semiconductor elements.

The memory device 500 may include conductive lines, such as word lines 104, which may also be referred to as gate lines or gate electrodes, drain lines 149D, source lines 149S, and bit lines 184. The word lines 104 may extend across the substrate 102 in a first direction. The source and drain lines 149S, 149D, and bit lines 184 may extend across the substrate 102 in a second direction, so as to cross the word lines 104.

The word lines 104, source lines 149S, drain lines 149D, and bit lines 184, may be formed by deposition processes, such as a chemical vapor deposition (CVD) process, a physical vapor deposition (PVD) process, an atomic layer deposition (ALD) process, a high density plasma CVD (HDPCVD) process, a metal organic CVD (MOCVD) process, or a plasma enhanced CVD (PECVD) process. The word lines 104, source lines 149S, drain lines 149D, and bit lines 184, may be formed of a conductive material, such as aluminum (Al), copper (Cu), tungsten (W), titanium (Ti), tantalum (Ta), gold (Au), platinum (Pt), other suitable materials, and/or combinations thereof.

The memory device 500 may include a selector layer 125 disposed between the source lines 149S and drain lines 149D and the word lines 104. The selector layer 125 may cover the word lines 104 (e.g., gate lines) disposed on the substrate 102 and may be electrically connected to the source lines 149S and drain lines 149D. In other words, the selector layer 125 may be a continuous semiconductor layer that is disposed between the word lines 104 and the source lines 149S and drain lines 149D.

Memory cells 130 may be disposed between and electrically connected to respective drain lines 149D and bit lines 184. However, in some embodiments, the memory cells 130 may be electrically connected to respective source lines 149S. For example, the memory cells 130 may be in the form of the MTJ memory device 130 and each bit line 184 may couple the top electrode 157 (see FIG. 22) of the memory device 130.

The selector layer 125 may include a high-k dielectric layer 106 and a channel layer 108. The source lines 149S and drain lines 149D may be electrically connected to the channel layer 108. The channel layer 108 may include channel regions 108R that overlap with the word lines 104, between the source lines 149S and drain lines 149D. During operation, a potential applied to the word lines 104 may operate to control current flow through the channel regions 108R and to the memory cells 130. By applying a voltage to a particular word line 104, the TFT transistor along the entire word line 104 may be energized to form a semiconducting channel 108R. Information may be written into a memory cell along the energized word line 104 such that a voltage applied to the source line 149S may be written into the corresponding memory cell 130. Alternatively, the stored charge in memory cell 130 may be read out through bit line 184 for the particular memory cell along the energized word line 104.

Accordingly, each channel region 108R, adjacent portions of the source and drain lines 149S, 149D, and word line 104, may form and/or operate as a thin film transistor (TFT) 120. The TFTs 120 may be configured to control a voltage applied to a corresponding memory cell 130. In various embodiments, each TFT 120 may operate as a selector for controlling a corresponding memory cell 130. Accordingly, the TFTs 120 may take the place of a conventional semiconductor device, such as a CMOS device formed in the substrate 102 by FEOL processes. In other words, there may be no need to electrically connect the TFTs 120 to FEOL control structures formed in the substrate 102. In addition, the continuous selector layer 125 may allow for a higher memory density, as compared to memory devices utilizing CMOS selectors.

Each memory structure 300 may include a TFT 120, a memory cell 130 electrically connected thereto, and an overlapping portion of the bit line 184 that is electrically connected to the memory cell 130. For example, the memory cells 130 and TFTs 120 of a memory structure 300 may be overlapped at intersections between the word lines 104 and the bit lines 184.

The memory device 500 may also include one or more dielectric layers surrounding the above features. For example, one or more TFTs 120 may be formed in a first dielectric layer 38, and the memory cells 130 may be formed in a second dielectric layer 170. However, in some embodiments, the dielectric layers 38 and 170 may be indistinguishable from one another.

Although not shown in FIGS. 24A-24C, the memory device 500 and/or memory structures 300 may include additional BEOL structures, such as conductive lines, resistors, via structures, via holes, etc.

Although FIGS. 2A-22 illustrate the fabrication of the memory structure 300 that combines a MJT memory cell 130 and a TFT 120 as a selector for the memory cell 130, various embodiments may consists of other memory cell 130 devices.

Figure 25A:
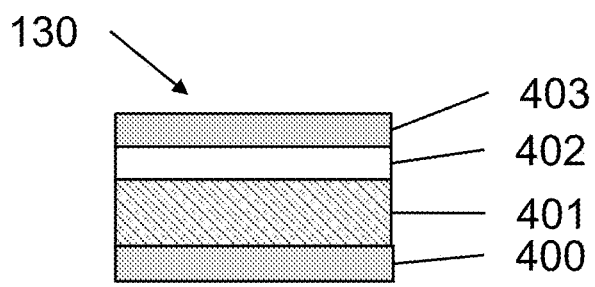
FIGS. 25A and 25B are cross-sectional views of different memory cells that may be utilized in memory structures, according to various embodiments of the present disclosure.

For example, FIG. 25A is a cross-sectional view of a memory cell 130 that may be utilized in the memory structure 300, according to various embodiments of the present disclosure. Referring to FIG. 25A, in some embodiments the memory cell 130 may be a PCM memory cell including a bottom electrode 400, a top electrode 403, a heater 401, and a phase change material layer 402. The phase change material layer 402 may operate as a data storage layer.

The heater 401 may be formed of thin film of TiN, TaN, or TiAlN that has a thickness in a range from about 5 to about 15 nm to provide Joule heating to the phase change material 162. Also, the heater 401 may function as a heat sink during quenching (during abrupt cutoff of the current applied to the heater 401 to 'freeze' the amorphous phase).

In some embodiments, the phase change material layer 402 comprises a binary system material of Ga—Sb, In—Sb, In—Se, Sb—Te, Ge—Te, and Ge—Sb; a ternary system, of Ge—Sb—Te, In—Sb—Te, Ga—Se—Te, Sn—Sb—Te, In—Sb—Ge, and Ga—Sb—Te; or a quaternary system of Ag—In—Sb—Te, Ge—Sn—Sb—Te, Ge—Sb—Se—Te, Te—Ge—Sb—S, Ge—Sb—Te—O, and Ge—Sb—Te—N. In some embodiments, the phase change material layer 402 comprises a chalcogenide alloy containing one or more elements from Group VI of the periodic table, such as a GST, a Ge—Sb—Te alloy (e.g., $Ge_2Sb_2Te_5$) having a thickness of 5 to 100 nm. The phase change material layer 402 may include other phase change resistive materials, such as metal oxides including tungsten oxide, nickel oxide, copper oxide, etc. The phase transition between the crystalline phase and the amorphous phase of the phase change material is related to the interplay between the long range order and the short range order of the structure of the phase change material. For example, collapse of the long range order generates the amorphous phase. The long range order in the crystalline phase facilitates electrical conduction, while the amorphous phase impedes electrical conduction and results in high electrical resistance. To tune the properties of the phase change material layer 402 for different needs, the phase change material layer 402 may be doped with various elements at different amounts to adjust the proportion of the short range order and the long range order inside the bonding structure of the material. The doped element may be any element used for semiconductor doping through the use of, for example, ion implantation.

Figure 25B:
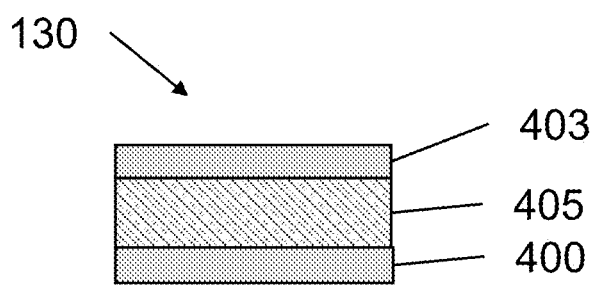

FIG. 25B is a cross-sectional view of another embodiment memory cell 130 that may be utilized in the memory structure 300, according to various embodiments of the present disclosure. Referring to FIG. 25B, in some embodiments the memory cell 130 may be a PCRAM memory cell including a bottom electrode 400, a top electrode 403, and a ferroelectric material layer 405, such as lead zirconate titanate (PZT) layer. The ferroelectric material layer 405 may operate as a data storage layer.

Figure 26:
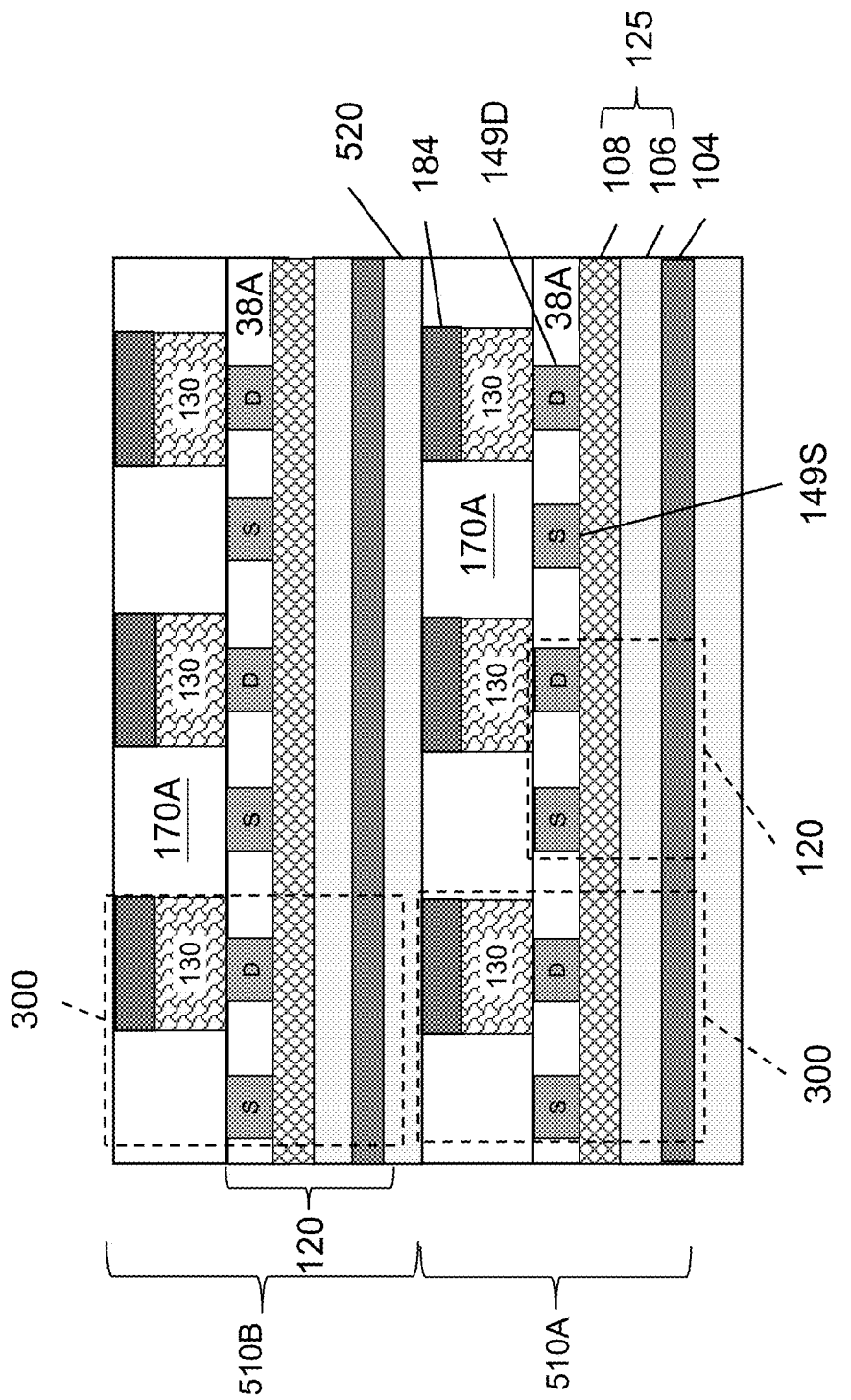
FIG. 26 is a vertical cross-sectional view of a memory device, according to various embodiments of the present disclosure.

FIG. 26 is a cross-sectional view of a memory device 502, according to various embodiments of the present disclosure. The memory device 502 is similar to the memory device 500 of FIGS. 23A-23C, the differences there between will be discussed in detail herein.

Referring to FIG. 26, the memory device 502 includes multiple vertically stacked memory structures 300. For example, the memory device 500 may include a first memory structure layer 510A disposed on the substrate 102, and second memory structure layer 510B disposed on the first memory structure layer 510A. The first and second memory structure layers 510A, 510B may each include at least one memory structure 300, a first dielectric layer 38A, and a second dielectric layer 170A. The first dielectric layers 38A may be disposed over the word lines 104, TFTs 120, and have formed therein the source lines 149S, and drain lines 149D. The second dielectric layers 170A may be disposed to have formed therein the memory cells 130 and the bit lines 184.

Although each of the first and second memory structure layers 510A, 510B are shown in FIG. 26 to include three memory structures 300, the first and second memory structure layers 510A, 510B may each include additional memory structures 300. In addition, while two memory structure layers 510A, 510B are shown, the memory device 502 may include additional memory structure layers, such as from 3 to 20 memory structure layers, which may be formed in BEOL and stacked on the second memory structure layer 510B. In some embodiments, the memory device 502 may include a dielectric layer 520 configured to separate the first and second memory structure layers 510A, 510B.

Figure 27B:
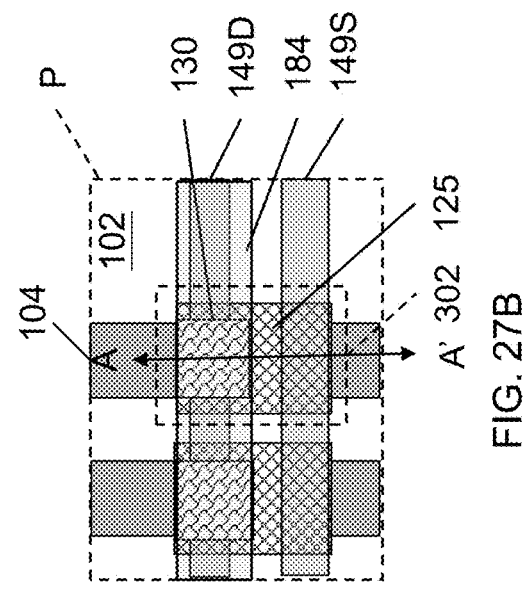
FIG. 27B is an enlarged view of a portion P of the memory device of FIG. 27A.
Figure 27A:
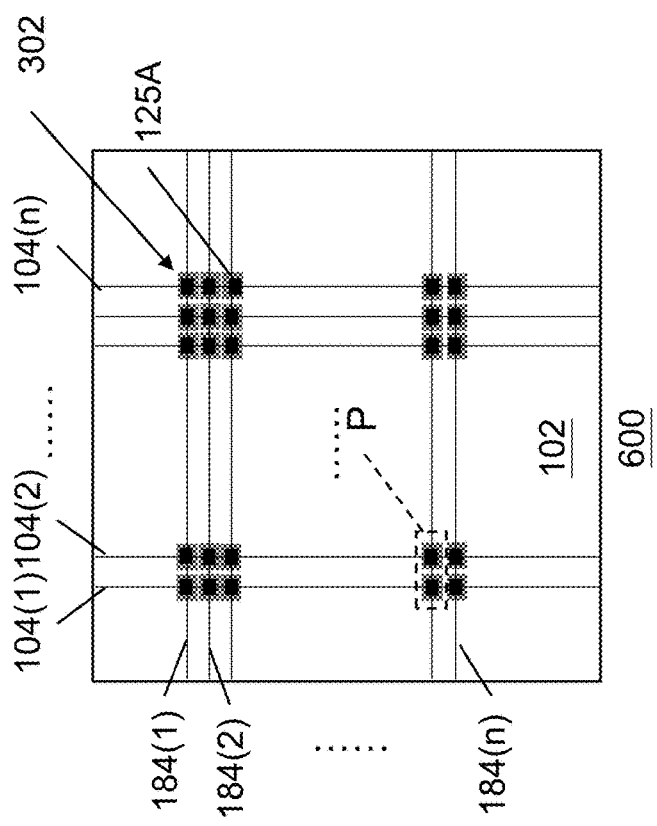
FIG. 27A is a top schematic view of a memory device, according to various embodiments of the present disclosure.
Figure 27C:
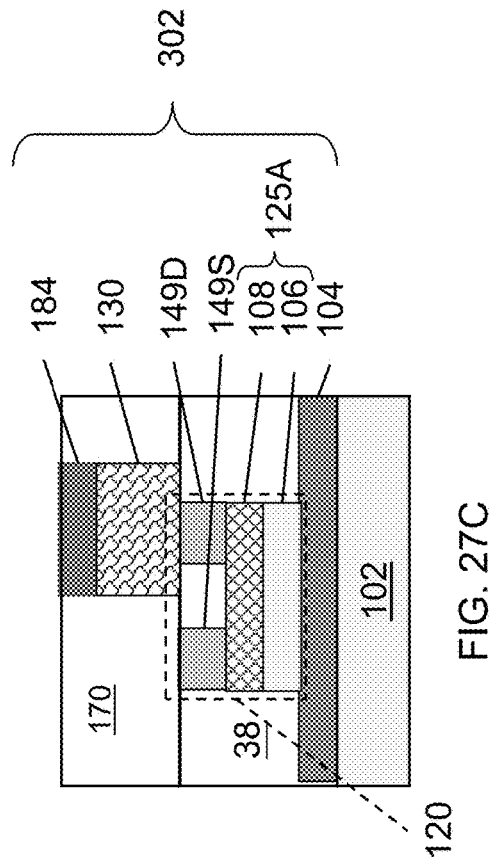
FIG. 27C is a cross-sectional view taken through line AA' of FIG. 27B.

FIG. 27A is a top schematic view of a memory device 600, according to various embodiments of the present disclosure, FIG. 27B is an enlarged view of a portion P of the memory device 600, and FIG. 27C is a cross-sectional view taken through line AA' of FIG. 27B. The memory device 600 may be similar to the memory device 500 of FIGS. 24A-24D, thus the differences there between will be discussed in detail herein.

Referring to FIGS. 27A-27C, the memory device 600 includes memory structures 302 including a memory cell 130 stacked on a TFT 120. However, the memory device includes a discrete selector layers 125A for each memory structure 302. In other words, each memory structure 302 includes a separate selector layer 125A comprising a high-k dielectric layer 106 and a channel layer 108, rather than a continuous selector layer 125.

Figure 28:
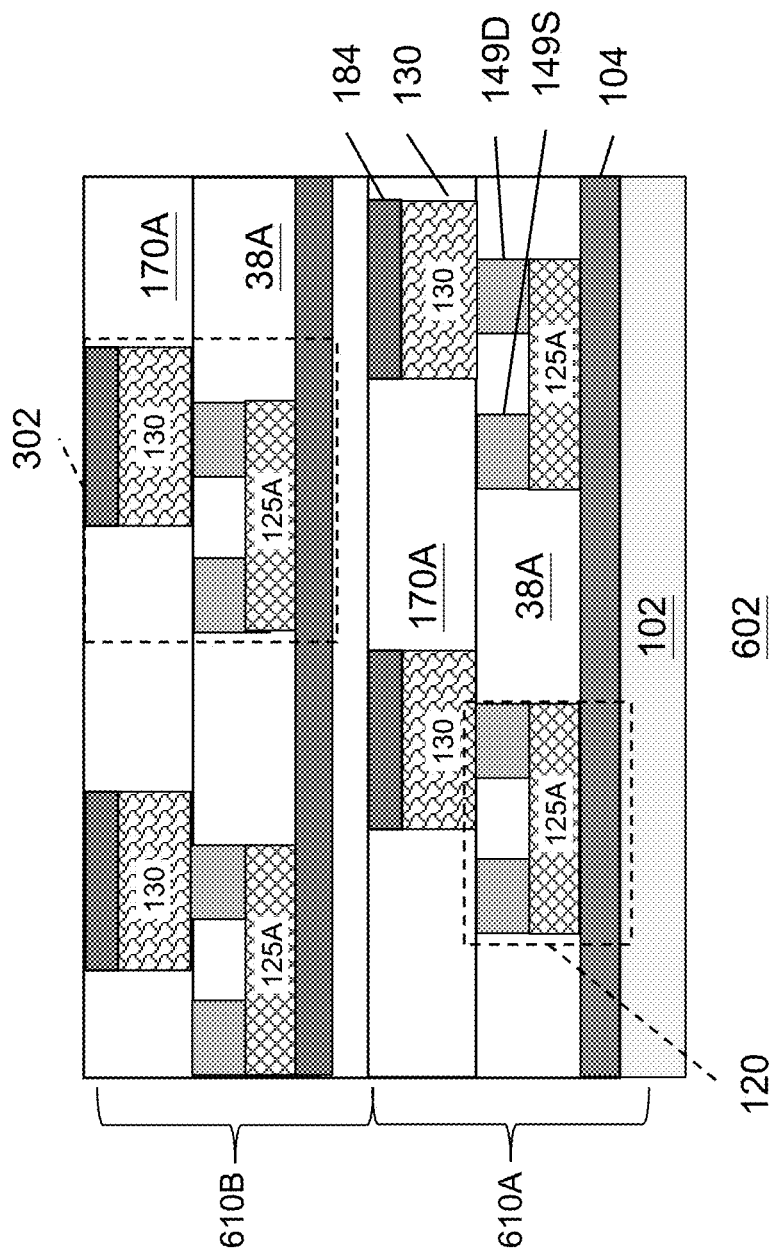
FIG. 28 is a vertical cross-sectional view of a memory device, according to various embodiments of the present disclosure.

FIG. 28 is a cross-sectional view of a memory device 602, according to various embodiments of the present disclosure. The memory device 602 may be similar to the memory device 600 shown in FIGS. 27A-27C, thus the differences there between will be discussed in detail herein.

Referring to FIG. 28, the memory device 602 includes multiple vertically stacked memory structures 302. For example, the memory device 602 may include a first memory structure layer 610A disposed on the substrate 102, and second memory structure layer 610B disposed on the first memory structure layer 610A. The first and second memory structure layers 610A, 610B may each include at least one memory structure 302, a first dielectric layer 38A, and a second dielectric layer 170A. The first dielectric layers 38A may be disposed on the word lines 104, TFTs 120, source lines 149S, and drain lines 149D. The second dielectric layers 170A may be disposed on the memory cells 130 and the bit lines 184.

Although each of the first and second memory structure layers 610A, 610B are shown in FIG. 28 to include two memory structures 302, the first and second memory structure layers 610A, 610B may each include additional memory structures 302. In addition, while two memory structure layers 610A, 610B are shown, the memory device 602 may include additional memory structure layers, such as from 3 to 20 memory structure layers, which may be formed in a BEOL position and stacked on the second memory structure layer 610B.

Figure 29:
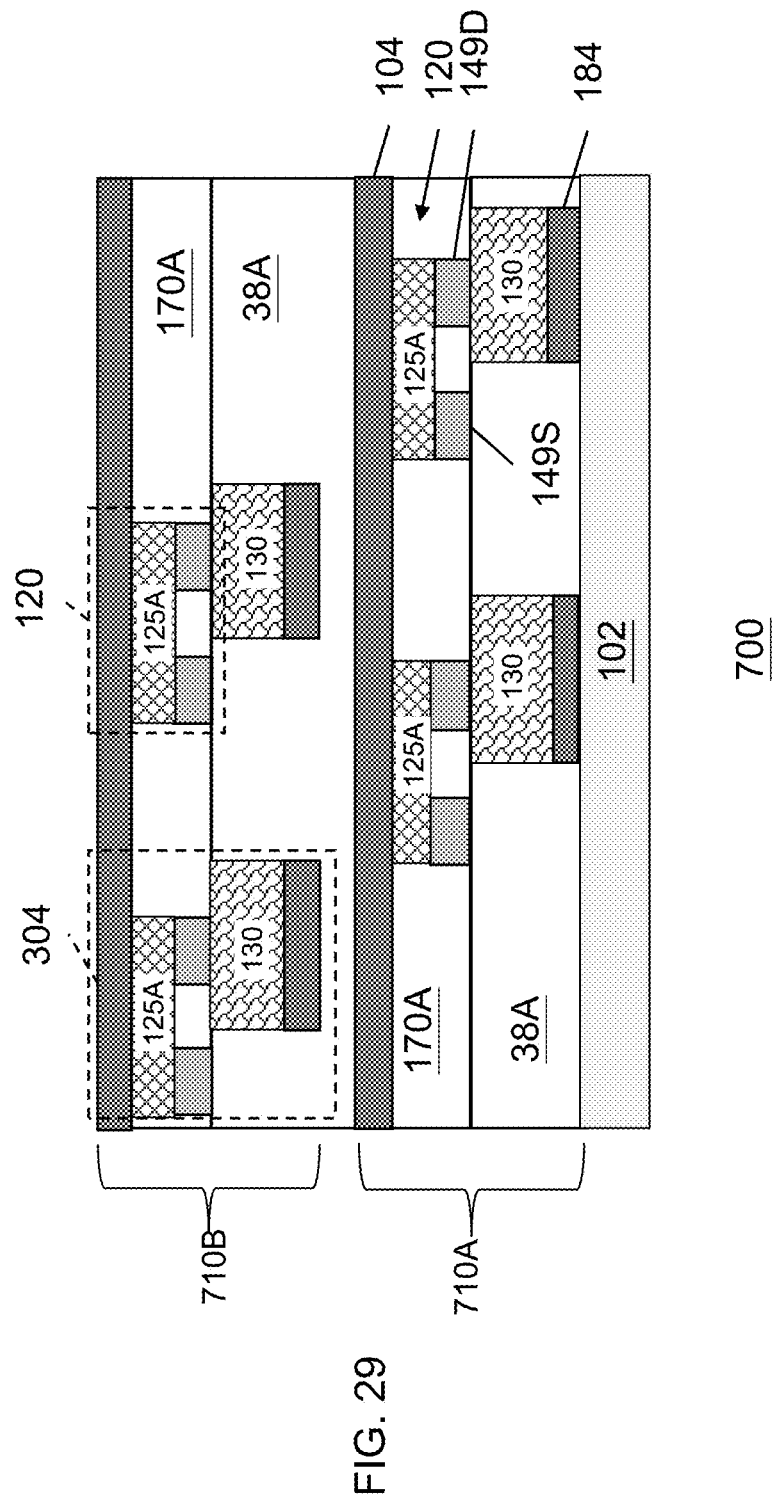
FIG. 29 is a vertical cross-sectional view of a memory device, according to various embodiments of the present disclosure.

FIG. 29 is a cross-sectional view of a memory device 700, according to various embodiments of the present disclosure. The memory device may be similar to the memory devices 500, 600, and 602 of FIGS. 23A-23C, 26, and 27A-27C, thus the difference there between will be discussed in detail herein.

Referring to FIG. 29, the memory device 700 includes memory structures 304 similar to the memory structures 302, except that in each memory structure 304, the memory cell 130 is disposed below the TFT 120. In particular, in the memory structure 304, the memory cell 130 and bit line 184 may be disposed below the source lines 149S and drain lines 149D, selector layer 108, and word line 104. In other words, the TFTs 120 of FIG. 29 may have a top gate structure, as compared to the bottom gate structure of the TFTs 120 of FIGS. 23C, 26, 27C, and 28.

In some embodiments, the memory device 700 may include a first memory structure layer 710A disposed on the substrate 102. The first memory structure layer 710A may include multiple memory structures 304. In particular, the memory cells 130 may be disposed on the substrate 102 in a first plane, and the TFTs 120 and/or selector layers 108 may be disposed on the substrate in a second plane, with the first and second planes being parallel to an upper surface of the substrate 102.

The memory device 700 may optionally include a second memory structure layer 710B disposed on the first memory structure layer 710A. In some embodiments, the memory device 700 may include one or more additional memory structure layers stacked on the second memory structure layer 710B.

Figure 30B:
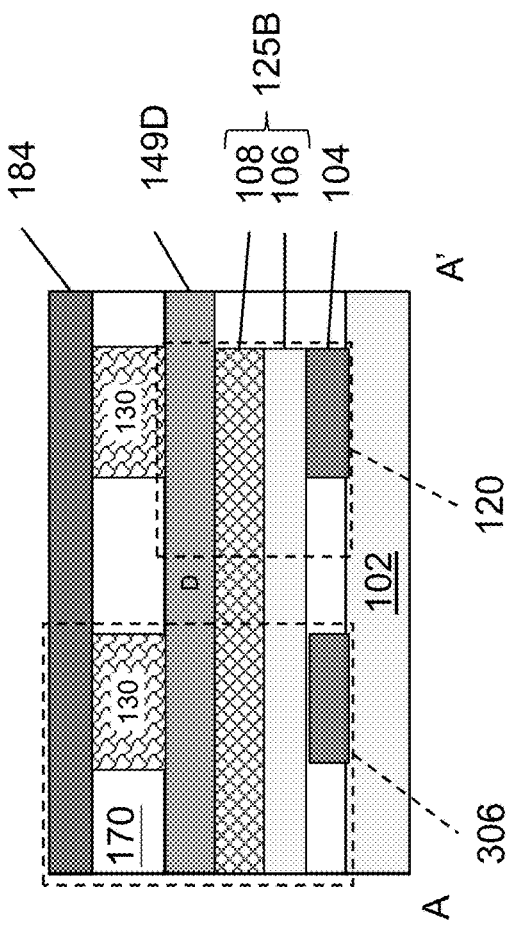
FIG. 30B is a cross-sectional view taken through line AA' of FIG. 30A.
Figure 30A:
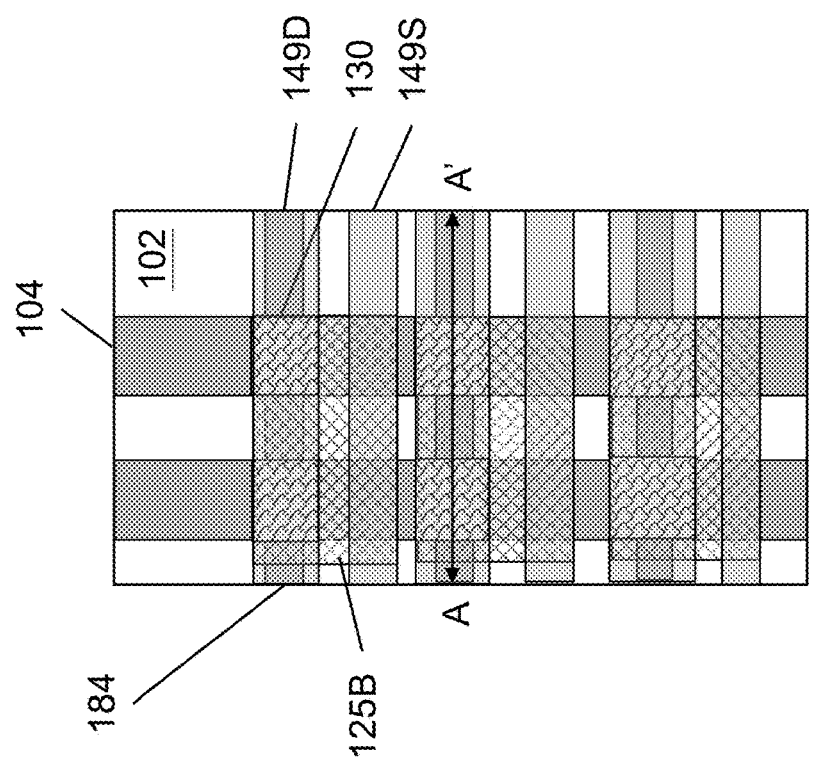
FIG. 30A is top schematic view of a portion of a memory device, according to various embodiments of the present disclosure.

FIG. 30A is top view of a portion of a memory device 800, according to various embodiments of the present disclosure, and FIG. 30B is a cross-sectional view taken through line AA' of FIG. 30A. Referring to FIGS. 30A and 30B, the memory device 800 includes memory structures 306 that are disposed on a substrate 102 and that each include a TFT 120 and a memory cell 130.

The memory device 800 includes selector layers 125B that each include a high-k layer 106 and a channel layer 108. In contrast to the memory device 500, each selector layer 125B covers a subset of word lines 104 (e.g., gate lines) disposed on the substrate 102. For example, each selector layer 125B may cover the word lines 104 of two adjacent memory structures 306. In other words, one selector layer 125B may include TFTs 120 that are electrically connected to two adjacent memory cells 130. source lines 149S and drain lines 149D are disposed on the channel layer 108, and the memory cells 130 are electrically connected to the respective drain lines 149D. However, in some embodiments, the memory cells 130 may be electrically connected to respective source lines 149S. Bit lines 184 (e.g., top electrodes) are electrically connected to the memory cells 130 and extend perpendicular to the word lines 104.

Accordingly, two memory cells 130 may be controlled using a single TFT 120, by controlling a potential applied to a corresponding word line 104 and source line 106. In other words, the word lines 104 each operate as gate controlling power flow through the overlapping channel regions of the TFTs 120. As such, the configuration of the memory device 700 allows for an increased memory cell density, as compared to a memory device reliant on transistors formed in a substrate during a FEOL process. While two memory cells 130 are shown to be controlled by each selector layer 125B, in other embodiments, the selector layers 125B may be configured to control additional memory cells 130.

Figure 31A:
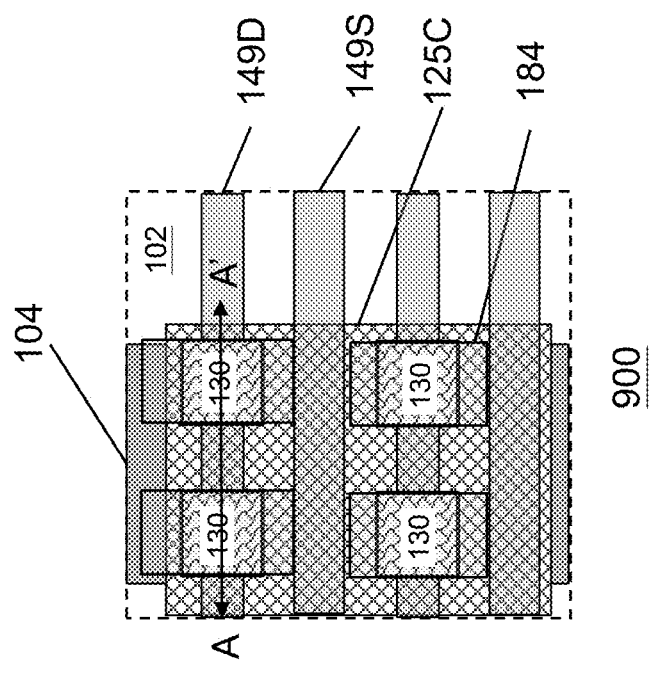
FIG. 31A is top schematic view of a portion of a memory device, according to various embodiments of the present disclosure.
Figure 31B:
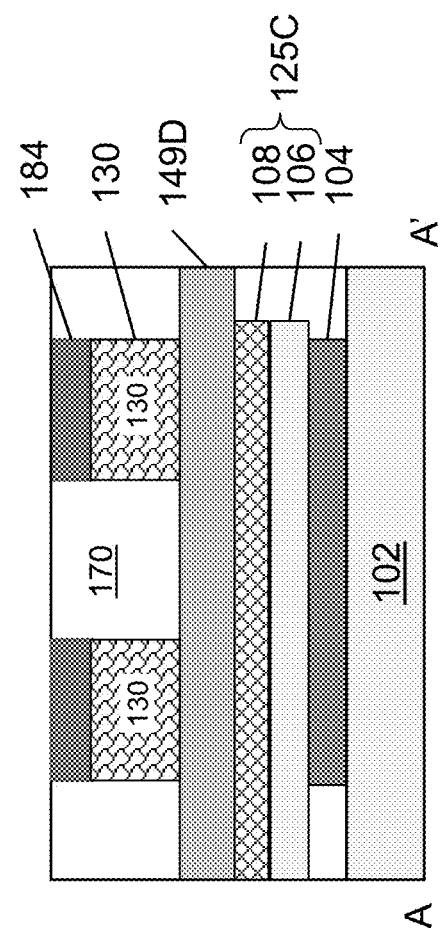
FIG. 31B is a cross-sectional view taken through line AA' of FIG. 31A.

FIG. 31A is top view of a portion of a memory device 900, according to various embodiments of the present disclosure, and FIG. 31B is a cross-sectional view taken through line AA' of FIG. 31A. The memory device 900 is similar to the memory device 800. Accordingly, only the differences therebetween will be discussed in detail.

Referring to FIGS. 31A and 31B, the memory device 900 includes multiple memory cells 130 that are electrically connected to the same selector layer 125C. In addition, a single word line 104 may be disposed below the selector layer 125C. Accordingly, current flow to the memory cells 130 may be controlled, at least in part, by a voltage applied to the word line 104. In some embodiments, the memory cells 130 may be individually controlled and/or addressed, by controlling current flow through the bit lines 184 electrically coupled thereto.

Figure 32:
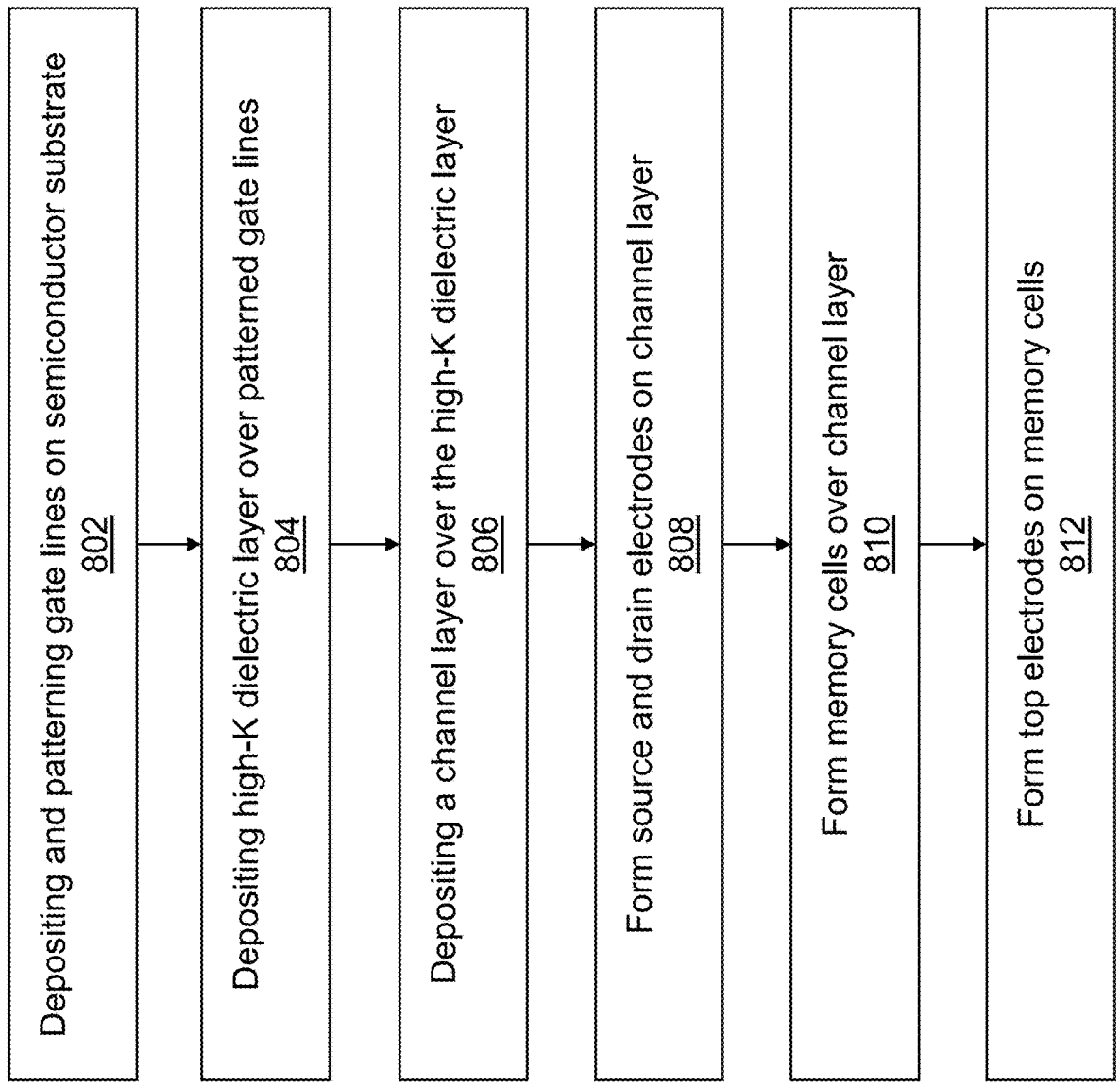
FIG. 32 is a flow diagram illustrating a method of forming a memory device, according to various embodiments of the present disclosure.

FIG. 32 is a flow diagram illustrating a method of forming a memory device, according to various embodiments of the present disclosure. Referring to FIG. 32, in step 802, the method includes depositing and patterning word lines 104 (e.g., gate lines) on a semiconductor substrate 102 or ILD 30. In particular, the word lines 104 may be formed by a deposition process, such as a chemical vapor deposition (CVD) process, a physical vapor deposition (PVD) process, an atomic layer deposition (ALD) process, a high density plasma CVD (HDPCVD) process, a metal organic CVD (MOCVD) process, or a plasma enhanced CVD (PECVD) process.

In step 804, a high-k dielectric layer 106 may be conformally deposited over the substrate 102 and word lines 104. The high-k dielectric layer may be formed of a high-k material, such as, zirconium dioxide ($ZrO_2$), aluminum oxide ($Al_2O_3$), hafnium oxide ($HfO_2$), tantalum oxide ($Ta_2O_5$), hafnium silicon oxide (HfSiO), hafnium silicon oxynitride (HfSiON), hafnium tantalum oxide (HMO), hafnium titanium oxide (HfTiO), hafnium zirconium oxide (HfZrO), zirconium silicate, zirconium aluminate, silicon nitride, silicon oxynitride, titanium oxide, a hafnium dioxide-alumina ($HfO_2$—$Al_2O_3$) alloy, combinations thereof, or the like. The high-k layer 106 may be formed by any suitable deposition process, such as one of the deposition processes described above.

In step 806, a channel layer 108 may be formed on the high-k dielectric layer 106. The channel layer may be formed of by depositing a thin film of any suitable semiconductor material. For example, the channel layer 108 may be formed by depositing a thin film of amorphous silicon, microcrystalline silicon, or polysilicon, or a semiconducting oxide, such as InGaZnO, InWO, InZnO, InSnO, $GaO_x$, $InO_x$ and the like, using any suitable deposition process, such as one of the deposition processes described above. In other embodiments, the channel layer may be formed of compound semiconductor materials, such as cadmium selenide, or the like. In some embodiments, an implantation step may optionally be performed on portions of the channel layer 108 to form active regions (e.g., source/drain regions) 113 on either side of a channel region 108R.

In step 808, source lines 149S and drain lines 149D may be alternately formed on the channel layer 108. The source lines 149S and drain lines 149D may comprise any suitable electrically conductive material, such as aluminum (Al), copper (Cu), tungsten (W), titanium (Ti), tantalum (Ta), gold (Au), platinum (Pt), other suitable materials, and/or combinations thereof. The source and drain electrodes may be formed of any suitable patterned deposition process.

In some embodiments, step 808 may further include forming a dielectric layer that surrounds the source and drain electrodes. For example, a dielectric material layer may be deposited and patterned to form channels or vias, and the source and drain electrodes may be formed in respective ones of the channels or vias.

In step 810, memory cells may be formed on the semiconductor layer, such that the memory cells are electrically connected to respective ones of the drain electrodes. The memory cells may include magnetoresistive random-access memory (MRAM) cells, resistive random-access memory (RRAM) cells, ferroelectric random-access memory (FeRAM) cells, phase-change random-access memory (PCRAM) cells, or a combination thereof. The memory cells may be formed by any suitable deposition process.

In some embodiments, step 810 may include forming a dielectric layer that surrounds the memory cells. For example, a dielectric material layer may be deposited and patterned to form channels or vias, and the memory cells source and drain electrodes may be formed in respective ones of the channels or vias.

In step 812, top electrodes (e.g., bit lines) may be formed on the memory cells, thereby forming a layer of memory structures on the substrate. The top electrodes may be formed of a conductive material as described above, using a deposition process as described above. In some embodiments, the top electrodes may be formed by depositing a conductive material in the channels or vias in which the memory cells are formed.

In some embodiments, steps 802-812 may optionally be repeated one or more times, to form additional layers of memory structures on the substrate. In various embodiments, an additional dielectric layer may be deposited between the layers of memory cells.

Various embodiments provide a memory device comprising: a substrate 102; a thin film transistor (TFT) 120 disposed on the substrate 102; and a memory cell 130 disposed on the substrate 102 and overlapped with the TFT 120. The TFT 120 is configured to selectively supply power to the memory cell. The memory cell 130 may be formed in a BEOL position.

Various embodiments provide a memory device comprising: a substrate 102; a selector layer 125 disposed on the substrate 102 and comprising channel regions; and memory cells overlapped with the selector layer 125. The memory cells 130 are disposed in a first plane parallel to a plane parallel to a top surface of the substrate.

Various embodiments provide a method of forming a memory device, comprising: forming word lines 104 on a substrate; forming a selector layer 125 on the word lines 104; alternately forming source lines 149S and drain lines 149D on the selector layer 125; forming memory cells 130 on the drain electrodes; and forming bit lines on the memory cells.

According to various embodiments, provided are memory devices that include TFTs and memory cells formed on a substrate 102 in a BEOL position. Accordingly, various embodiments provide a higher memory density than conventional memory devices that utilize FEOL selectors to control memory cells. In addition, the various embodiments provide memory devices having a reduced series resistance, as compared to memory devices that utilize FEOL selectors.

The various embodiment memory device include a memory cell coupled to a TFT 120 selector device. By forming a TFT transistor 120 as the selector for each memory cell 130 the various embodiments are provided with a number of advantages. Thin-film transistors (TFTs) provide a number of advantages for BEOL integration. For example, TFTs may be processed at low temperature and may add functionality to the BEOL while valuable chip area may be made available in the FEOL. Use of TFTs 120 in the BEOL may be used as a scaling path for 3 nm node fabrication (N3) or beyond by moving peripheral devices such as power gates or Input/Output (I/O) devices from the FEOL into higher metal levels of the BEOL. Moving the TFTs from the FEOL to the BEOL may result in about 5-10% area shrink for a given device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory device comprising:
   a substrate;
   a first bit line disposed on the substrate;
   a first memory cell disposed on the first bit line;
   a first selector layer configured to selectively provide electric power to the first memory cell;
   a second bit line disposed on the substrate;
   a second memory cell disposed on the second bit line;
   a second selector layer configured to selectively provide electric power to the second memory cell;
   a dielectric layer disposed on the substrate and in which the first bit line, the second bit line, the first memory cell, the second memory cell, the first selector layer, and the second selector layer are embedded; and
   a word line disposed on the dielectric layer and configured to control current flow through the first selector layer and the second selector layer,
   wherein the first selector layer and the second selector layer are discrete elements embedded in the dielectric layer, each of the first selector layer and the second selector layer comprising a channel layer comprising amorphous silicon or a semiconducting oxide, and a high-k dielectric layer disposed between the channel layer and the word line.

2. The memory device of claim 1, wherein the first memory cell comprises:
a top electrode contacting a drain electrode of the first selector layer;
a bottom contacting the first bit line; and
a data storage layer disposed between the top electrode and the bottom electrode.

3. The memory device of claim 2, further comprising:
a source electrode and a drain electrode disposed under each channel layer.

4. The memory device of claim 1, wherein the first memory cell and the second memory cell are not electrically connected to control elements formed in the substrate.

5. The memory device of claim 1, wherein:
the substrate is a semiconductor substrate including complementary metal-oxide-semiconductor transistors; and
the first memory cell, the second memory cell, the first selector layer, and the second selector layer are formed on lower interconnect-level structures formed on the substrate.

6. The memory device of claim 1, wherein the first memory cell and the second memory cell each comprise a magnetoresistive random-access memory (MRAM) cell, a resistive random-access memory (RRAM) cell, a ferroelectric random-access memory (FeRAM) cell, or a phase-change random-access memory (PCRAM) cell.

7. The memory device of claim 1, wherein the dielectric layer comprises a first dielectric layer disposed on the substrate, surrounding the first bit line, the second bit line, the first memory cell, and the second memory cell.

8. The memory device of claim 7, wherein the dielectric layer comprises a second dielectric layer disposed on the first dielectric layer, surrounding the first selector layer and the second selector layer.

9. A memory device comprising:
bit lines;
memory cells disposed on the bit lines;
drain lines disposed on the memory cells;
selector layers disposed on the drain lines and configured to selectively provide electric power to corresponding memory cells;
a dielectric layer surrounding the bit lines, the memory cells, and the selector layers; and
a word line disposed on the dielectric layer and configured to control current flow through the selector layers,
wherein the selector layers are discrete elements embedded in the dielectric layer, each of the selector layers comprising a channel layer comprising amorphous silicon or a semiconducting oxide, and a high-k dielectric layer disposed between the channel layer and the word line.

10. The memory device of claim 9, wherein each memory cell comprises:
a top electrode;
a bottom electrode; and
a data storage layer disposed between the top electrode and the bottom electrode.

11. The memory device of claim 9, further comprising:
a source electrode and a drain electrode disposed under each the channel layer.

12. The memory device of claim 9, further comprising:
a substrate; and
lower interconnect-level structures disposed on the substrate and under the bit lines and the dielectric layer.

13. The memory device of claim 12, wherein the memory cells are not electrically connected to control elements formed in the substrate.

14. The memory device of claim 12, wherein the substrate is a semiconductor substrate including complementary metal-oxide-semiconductor transistors.

15. The memory device of claim 9, wherein the memory cells comprise a magnetoresistive random-access memory (MRAM) cell, a resistive random-access memory (RRAM) cell, a ferroelectric random-access memory (FeRAM) cell, or a phase-change random-access memory (PCRAM) cell.

16. A memory device comprising:
bit lines;
memory cells electrically connected to the bit lines;
a first dielectric layer surrounding the bit lines and the memory cells;
selector layers that are each configured to selectively provide electric power to a corresponding memory cell;
a second dielectric layer surrounding the selector layers; and
a word line disposed on the second dielectric layer and configured to control current flow through the selector layers,
wherein the selector layers are discrete elements embedded in the second dielectric layer, each of the selector layers comprising a channel layer comprising amorphous silicon or a semiconducting oxide, and a high-k dielectric layer disposed between the channel layer and the word line.

17. The memory device of claim 16, wherein each memory cell comprises a magnetoresistive random-access memory (MRAM) cell, a resistive random-access memory (RRAM) cell, a ferroelectric random-access memory (FeRAM) cell, or a phase-change random-access memory (PCRAM cell).

18. The memory device of claim 16, wherein each memory cell comprises:
a top electrode;
a bottom electrode; and
a data storage layer disposed between the top electrode and the bottom electrode.

19. The memory device of claim 16, further comprising:
a source electrode and a drain electrode disposed under each channel layer.

20. The memory device of claim 16, further comprising:
a substrate; and
lower interconnect-level structures disposed on the substrate and under the bit lines and the first dielectric layer,
wherein the memory cells are not electrically connected to control elements formed in the substrate.

* * * * *